US010964380B1

(12) United States Patent
Wang et al.

(10) Patent No.: US 10,964,380 B1
(45) Date of Patent: Mar. 30, 2021

(54) INTEGRATED DEVICE COMPRISING MEMORY BITCELLS COMPRISING SHARED PRELOAD LINE AND SHARED ACTIVATION LINE

(71) Applicant: QUALCOMM Incorporated, San Diego, CA (US)

(72) Inventors: Zhongze Wang, San Diego, CA (US); Yandong Gao, San Diego, CA (US); Xia Li, San Diego, CA (US); Ye Lu, San Diego, CA (US); Xiaochun Zhu, San Diego, CA (US); Xiaonan Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/784,149

(22) Filed: Feb. 6, 2020

(51) Int. Cl.
| | | |
|---|---|---|
| *G11C 11/41* | (2006.01) | |
| *G11C 11/412* | (2006.01) | |
| *G11C 11/56* | (2006.01) | |
| *G11C 11/419* | (2006.01) | |
| *H01L 27/11* | (2006.01) | |
| *G11C 11/418* | (2006.01) | |
| *H01L 23/528* | (2006.01) | |
| *H01L 23/522* | (2006.01) | |
| *H01L 23/00* | (2006.01) | |

(52) U.S. Cl.
CPC .......... *G11C 11/412* (2013.01); *G11C 11/418* (2013.01); *G11C 11/419* (2013.01); *G11C 11/56* (2013.01); *H01L 27/1104* (2013.01); *H01L 23/528* (2013.01); *H01L 23/5226* (2013.01); *H01L 24/03* (2013.01); *H01L 24/05* (2013.01); *H01L 24/11* (2013.01); *H01L 24/13* (2013.01); *H01L 2224/0401* (2013.01); *H01L 2224/0557* (2013.01); *H01L 2224/13023* (2013.01); *H01L 2924/1437* (2013.01)

(58) Field of Classification Search
CPC ... G11C 11/412; G11C 11/418; G11C 11/419; G11C 11/56; H01L 27/1104; H01L 23/5226; H01L 23/528; H01L 24/03; H01L 24/05; H01L 24/11; H01L 24/13; H01L 2224/0401; H01L 2224/0557; H01L 2224/13023; H01L 2924/1437
See application file for complete search history.

(56) References Cited

U.S. PATENT DOCUMENTS 8,631,365 B2 * 1/2014 Kengeri .................. G06F 30/30
716/103
9,666,286 B2 * 5/2017 Lee ......................... G11C 16/08
(Continued)

*Primary Examiner* — Vanthu T Nguyen
(74) *Attorney, Agent, or Firm* — Michelle S. Gallardo; Qualcomm Incorporated

(57) ABSTRACT

A memory circuit that includes a memory bitcell. The memory bitcell includes a six-transistor circuit configuration, a first transistor coupled to the six-transistor circuit configuration, a second transistor coupled to the first transistor, a third transistor coupled to the second transistor, and a capacitor coupled to the second transistor and the third transistor. The memory circuit includes a read word line coupled to the third transistor, a read bit line coupled to the third transistor, and an activation line coupled to the second transistor. The memory bitcell may be configured to operate as a NAND memory bitcell. The memory bitcell may be configured to operate as a NOR memory bitcell.

26 Claims, 25 Drawing Sheets

(56) References Cited

U.S. PATENT DOCUMENTS

| | | | |
|---|---|---|---|
| 10,249,362 B2 * | 4/2019 | Shu | G11C 7/18 |
| 10,725,777 B2 * | 7/2020 | Shu | G11C 11/412 |
| 2005/0226079 A1 * | 10/2005 | Zhu | G11C 11/40603 |
| | | | 365/230.03 |

* cited by examiner

NAND BITCELL BINARY VALUE

BINARY PRE-LOAD AND BINARY ACTIVATION

NOR BITCELL BINARY VALUE

BINARY PRE-LOAD AND BINARY ACTIVATION

NAND BITCELL MULTI-BIT VALUE
MULTI-BIT PRE-LOAD AND MULTI-BIT ACTIVATION

| | 260 | 242 | 120 | 118 | 106 | 242 | 120 | 118 | 106 | 242 | 120 | 118 | 106 |
|---|---|---|---|---|---|---|---|---|---|---|---|---|---|
| 8b=256 level PRE-LOAD Sb | Vdd=1V PRE-LOAD VOLTAGE | LEVEL=255 ACTIVATION VOLTAGE | BINARY WEIGHT | NAND CAP VOLTAGE | CHARGE SHARE RBL VOLTAGE | LEVEL=130 ACTIVATION VOLTAGE | BINARY WEIGHT | NAND CAP VOLTAGE | CHARGE SHARE RBL VOLTAGE | LEVEL=0 ACTIVATION VOLTAGE | BINARY WEIGHT | NAND CAP VOLTAGE | CHARGE SHARE RBL VOLTAGE |
| 0 | 0.00 | 1 | 0 | 0.000 | 0.000 | 0.5078 | 1 | 0.000 | 0.000 | | 0 | 0.000 | 0.000 |
| 1 | 0.00 | 1 | 0 | 0.004 | 0.004 | 0.5078 | 1 | 0.002 | 0.002 | | 0 | 0.000 | 0.000 |
| 10 | 0.04 | 1 | 0 | 0.039 | 0.039 | 0.5078 | 1 | 0.020 | 0.020 | | 0 | 0.000 | 0.000 |
| 20 | 0.08 | 1 | 0 | 0.078 | 0.078 | 0.5078 | 1 | 0.040 | 0.040 | | 0 | 0.000 | 0.000 |
| 30 | 0.12 | 1 | 0 | 0.117 | 0.117 | 0.5078 | 1 | 0.060 | 0.060 | | 0 | 0.000 | 0.000 |
| 40 | 0.16 | 1 | 0 | 0.156 | 0.156 | 0.5078 | 1 | 0.079 | 0.079 | | 0 | 0.000 | 0.000 |
| 50 | 0.20 | 1 | 0 | 0.195 | 0.195 | 0.5078 | 1 | 0.099 | 0.099 | | 0 | 0.000 | 0.000 |
| 60 | 0.23 | 1 | 0 | 0.234 | 0.234 | 0.5078 | 1 | 0.119 | 0.119 | | 0 | 0.000 | 0.000 |
| 70 | 0.27 | 1 | 0 | 0.273 | 0.273 | 0.5078 | 1 | 0.139 | 0.139 | | 0 | 0.000 | 0.000 |
| 80 | 0.31 | 1 | 0 | 0.313 | 0.313 | 0.5078 | 1 | 0.159 | 0.159 | | 0 | 0.000 | 0.000 |
| 90 | 0.35 | 1 | 0 | 0.352 | 0.352 | 0.5078 | 1 | 0.179 | 0.179 | | 0 | 0.000 | 0.000 |
| 100 | 0.39 | 1 | 0 | 0.391 | 0.391 | 0.5078 | 1 | 0.198 | 0.198 | | 0 | 0.000 | 0.000 |
| 110 | 0.43 | 1 | 0 | 0.430 | 0.430 | 0.5078 | 1 | 0.218 | 0.218 | | 0 | 0.000 | 0.000 |
| 120 | 0.47 | 1 | 0 | 0.469 | 0.469 | 0.5078 | 1 | 0.238 | 0.238 | | 0 | 0.000 | 0.000 |
| 130 | 0.51 | 1 | 0 | 0.508 | 0.508 | 0.5078 | 1 | 0.258 | 0.258 | | 0 | 0.000 | 0.000 |
| 140 | 0.55 | 1 | 0 | 0.547 | 0.547 | 0.5078 | 1 | 0.278 | 0.278 | | 0 | 0.000 | 0.000 |
| 150 | 0.59 | 1 | 0 | 0.586 | 0.586 | 0.5078 | 1 | 0.298 | 0.298 | | 0 | 0.000 | 0.000 |
| 160 | 0.63 | 1 | 0 | 0.625 | 0.625 | 0.5078 | 1 | 0.317 | 0.317 | | 0 | 0.000 | 0.000 |
| 170 | 0.66 | 1 | 0 | 0.664 | 0.664 | 0.5078 | 1 | 0.337 | 0.337 | | 0 | 0.000 | 0.000 |
| 180 | 0.70 | 1 | 0 | 0.703 | 0.703 | 0.5078 | 1 | 0.357 | 0.357 | | 0 | 0.000 | 0.000 |
| 190 | 0.74 | 1 | 0 | 0.742 | 0.742 | 0.5078 | 1 | 0.377 | 0.377 | | 0 | 0.000 | 0.000 |
| 200 | 0.78 | 1 | 0 | 0.781 | 0.781 | 0.5078 | 1 | 0.397 | 0.397 | | 0 | 0.000 | 0.000 |
| 210 | 0.82 | 1 | 0 | 0.820 | 0.820 | 0.5078 | 1 | 0.417 | 0.417 | | 0 | 0.000 | 0.000 |
| 220 | 0.86 | 1 | 0 | 0.859 | 0.859 | 0.5078 | 1 | 0.436 | 0.436 | | 0 | 0.000 | 0.000 |
| 230 | 0.90 | 1 | 0 | 0.898 | 0.898 | 0.5078 | 1 | 0.456 | 0.456 | | 0 | 0.000 | 0.000 |
| 240 | 0.94 | 1 | 0 | 0.938 | 0.938 | 0.5078 | 1 | 0.476 | 0.476 | | 0 | 0.000 | 0.000 |
| 250 | 0.98 | 1 | 0 | 0.977 | 0.977 | 0.5078 | 1 | 0.496 | 0.496 | | 0 | 0.000 | 0.000 |
| 255 | 1.00 | 1 | 0 | 0.996 | 0.996 | 0.5078 | 1 | 0.506 | 0.506 | | 0 | 0.000 | 0.000 |

*FIG. 12*

NOR BITCELL MULTI-BIT VALUE
MULTI-BIT PRE-LOAD AND MULTI-BIT ACTIVATION

| 260 | 242 | 120 | 118 | 106 | 242 | 120 | 118 | 106 | 242 | 120 | 118 | 106 |
|---|---|---|---|---|---|---|---|---|---|---|---|---|
| Vdd=1V PRE-LOAD VOLTAGE | LEVEL-255 ACTIVATION VOLTAGE | BINARY WEIGHT | NOR CAP VOLTAGE | CHARGE SHARE RBL VOLTAGE | LEVEL-130 ACTIVATION VOLTAGE | BINARY WEIGHT | NOR CAP VOLTAGE | CHARGE SHARE RBL VOLTAGE | LEVEL-0 ACTIVATION VOLTAGE | BINARY WEIGHT | NOR CAP VOLTAGE | CHARGE SHARE RBL VOLTAGE |
| Sb=256 LEVEL PRE-LOAD Sb | | | | | | | | | | | | |
| 0 | 0.00 | 1 | 0 | 0.000 | 0.000 | 0.5078 | 1 | 0.000 | 0.000 | 0 | 0 | 0.000 | 0.000 |
| 1 | 0.00 | 1 | 0 | 0.000 | 0.000 | 0.5078 | 1 | 0.002 | 0.002 | 0 | 0 | 0.004 | 0.004 |
| 10 | 0.04 | 1 | 0 | 0.000 | 0.000 | 0.5078 | 1 | 0.020 | 0.020 | 0 | 0 | 0.039 | 0.039 |
| 20 | 0.08 | 1 | 0 | 0.000 | 0.000 | 0.5078 | 1 | 0.040 | 0.040 | 0 | 0 | 0.078 | 0.078 |
| 30 | 0.12 | 1 | 0 | 0.000 | 0.000 | 0.5078 | 1 | 0.060 | 0.060 | 0 | 0 | 0.117 | 0.117 |
| 40 | 0.16 | 1 | 0 | 0.000 | 0.000 | 0.5078 | 1 | 0.079 | 0.079 | 0 | 0 | 0.156 | 0.156 |
| 50 | 0.20 | 1 | 0 | 0.000 | 0.000 | 0.5078 | 1 | 0.099 | 0.099 | 0 | 0 | 0.195 | 0.195 |
| 60 | 0.23 | 1 | 0 | 0.000 | 0.000 | 0.5078 | 1 | 0.119 | 0.119 | 0 | 0 | 0.234 | 0.234 |
| 70 | 0.27 | 1 | 0 | 0.000 | 0.000 | 0.5078 | 1 | 0.139 | 0.139 | 0 | 0 | 0.273 | 0.273 |
| 80 | 0.31 | 1 | 0 | 0.000 | 0.000 | 0.5078 | 1 | 0.159 | 0.159 | 0 | 0 | 0.313 | 0.313 |
| 90 | 0.35 | 1 | 0 | 0.000 | 0.000 | 0.5078 | 1 | 0.179 | 0.179 | 0 | 0 | 0.352 | 0.352 |
| 100 | 0.39 | 1 | 0 | 0.000 | 0.000 | 0.5078 | 1 | 0.198 | 0.198 | 0 | 0 | 0.391 | 0.391 |
| 110 | 0.43 | 1 | 0 | 0.000 | 0.000 | 0.5078 | 1 | 0.218 | 0.218 | 0 | 0 | 0.430 | 0.430 |
| 120 | 0.47 | 1 | 0 | 0.000 | 0.000 | 0.5078 | 1 | 0.238 | 0.238 | 0 | 0 | 0.469 | 0.469 |
| 130 | 0.51 | 1 | 0 | 0.000 | 0.000 | 0.5078 | 1 | 0.258 | 0.258 | 0 | 0 | 0.508 | 0.508 |
| 140 | 0.55 | 1 | 0 | 0.000 | 0.000 | 0.5078 | 1 | 0.278 | 0.278 | 0 | 0 | 0.547 | 0.547 |
| 150 | 0.59 | 1 | 0 | 0.000 | 0.000 | 0.5078 | 1 | 0.298 | 0.298 | 0 | 0 | 0.586 | 0.586 |
| 160 | 0.63 | 1 | 0 | 0.000 | 0.000 | 0.5078 | 1 | 0.317 | 0.317 | 0 | 0 | 0.625 | 0.625 |
| 170 | 0.66 | 1 | 0 | 0.000 | 0.000 | 0.5078 | 1 | 0.337 | 0.337 | 0 | 0 | 0.664 | 0.664 |
| 180 | 0.70 | 1 | 0 | 0.000 | 0.000 | 0.5078 | 1 | 0.357 | 0.357 | 0 | 0 | 0.703 | 0.703 |
| 190 | 0.74 | 1 | 0 | 0.000 | 0.000 | 0.5078 | 1 | 0.377 | 0.377 | 0 | 0 | 0.742 | 0.742 |
| 200 | 0.78 | 1 | 0 | 0.000 | 0.000 | 0.5078 | 1 | 0.397 | 0.397 | 0 | 0 | 0.781 | 0.781 |
| 210 | 0.82 | 1 | 0 | 0.000 | 0.000 | 0.5078 | 1 | 0.417 | 0.417 | 0 | 0 | 0.820 | 0.820 |
| 220 | 0.86 | 1 | 0 | 0.000 | 0.000 | 0.5078 | 1 | 0.436 | 0.436 | 0 | 0 | 0.859 | 0.859 |
| 230 | 0.90 | 1 | 0 | 0.000 | 0.000 | 0.5078 | 1 | 0.456 | 0.456 | 0 | 0 | 0.898 | 0.898 |
| 240 | 0.94 | 1 | 0 | 0.000 | 0.000 | 0.5078 | 1 | 0.476 | 0.476 | 0 | 0 | 0.938 | 0.938 |
| 250 | 0.98 | 1 | 0 | 0.000 | 0.000 | 0.5078 | 1 | 0.496 | 0.496 | 0 | 0 | 0.977 | 0.977 |
| 255 | 1.00 | 1 | 0 | 0.000 | 0.000 | 0.5078 | 1 | 0.506 | 0.506 | 0 | 0 | 0.996 | 0.996 |

INTEGRATED DEVICE COMPRISING MEMORY BITCELLS COMPRISING SHARED PRELOAD LINE AND SHARED ACTIVATION LINE

FIELD

Various features relate to integrated devices, but more specifically to integrated devices that includes memory bitcells comprising shared pre-load line and shared activation line.

BACKGROUND

Integrated devices include logic circuits that are configured to perform logic functions. An integrated device may include thousands or millions of logic circuits that are organized in a certain layout or configuration. The layout of these logic circuits in an integrated device are very complicated and may not be ideal nor optimal for fabrication processes that are used to fabricate the integrated devices. The is an ongoing need to provide logic circuits with improved layouts, which can result in better performing integrated devices and a layout that is optimized for integrated device fabrication processes.

SUMMARY

Various features relate to integrated devices, but more specifically to integrated devices that includes memory bitcells comprising shared pre-load line and shared activation line.

One example provides a memory circuit that includes a memory bitcell. The memory bitcell includes a six-transistor circuit configuration, a first transistor coupled to the six-transistor circuit configuration, a second transistor coupled to the first transistor, a third transistor coupled to the second transistor, and a capacitor coupled to the second transistor and the third transistor. The memory circuit includes a read word line coupled to the third transistor, a read bit line coupled to the third transistor, and an activation line coupled to the second transistor. The memory bitcell may be configured to operate as a NAND memory bitcell. The memory bitcell may be configured to operate as a NOR memory bitcell.

Another example provides a memory circuit that includes a first memory bitcell, a second memory bitcell, a third memory bitcell, and a fourth memory bitcell. The first memory bitcell, the second memory bitcell, the third memory bitcell, and the fourth memory bitcell, each includes a six-transistor circuit configuration, a first transistor coupled to the six-transistor circuit configuration; a second transistor coupled to the first transistor, a third transistor coupled to the second transistor, and a capacitor coupled to the second transistor and the third transistor. The memory circuit includes a first read word line coupled to the third transistor of the first memory bitcell and the third transistor of the third memory bitcell. The memory circuit includes a first read bit line coupled to the third transistor of the first memory bitcell and the third transistor of the third memory bitcell. The memory circuit includes a first activation line coupled to the second transistor of the first memory bitcell and the second transistor of the second memory bitcell. The memory circuit includes a second read word line coupled to the third transistor of the second memory bitcell and the third transistor of the fourth memory bitcell. The memory circuit includes a second read bit line coupled to the third transistor of the second memory bitcell and the third transistor of the fourth memory bitcell. The memory circuit includes a second activation line coupled to the second transistor of the third memory bitcell and the second transistor of the fourth memory bitcell.

Another example provides an integrated device that includes a substrate and a memory bitcell located over the substrate. The memory bitcell includes a six-transistor circuit configuration, a first transistor coupled to the six-transistor circuit configuration, a second transistor coupled to the first transistor, a third transistor coupled to the second transistor, a capacitor coupled to the second transistor and the third transistor. The integrated device includes a read word line located over the substrate, where the read word line is coupled to the third transistor. The integrated device includes a read bit line located over the substrate, where the read bit line is coupled to the third transistor. The integrated device includes an activation line located over the substrate, where the activation line is coupled to the second transistor.

Another example provides an integrated device that includes a substrate and a memory bitcell located over the substrate. The memory bitcell includes means for transistor circuit operation, first means for transistor operation coupled to the means for transistor circuit operation, second means for transistor operation coupled to the first means for transistor operation, third means for transistor operation coupled to the second means for transistor operation, and means for capacitance coupled to the second means for transistor operation and the third means for transistor operation. The integrated device includes a read word line located over the substrate, where the read word line is coupled to the third means for transistor operation. The integrated device includes a read bit line located over the substrate, wherein the read bit line is coupled to the third means for transistor operation. The integrated device includes an activation line located over the substrate, where the activation line is coupled to the second means for transistor operation.

BRIEF DESCRIPTION OF THE DRAWINGS

Various features, nature and advantages may become apparent from the detailed description set forth below when taken in conjunction with the drawings in which like reference characters identify correspondingly throughout.

FIG. 12 illustrates a table for a NAND bitcell with multi-bit pre-load voltage and multi-bit activation voltage.

FIG. 13 illustrates a table for a NOR bitcell with multi-bit pre-load voltage and multi-bit activation voltage.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes an integrated device that includes a substrate and a memory bitcell located over the substrate. The memory bitcell includes a six-transistor circuit configuration, a first transistor coupled to the six-transistor circuit configuration, a second transistor coupled to the first transistor, a third transistor coupled to the second transistor, and a capacitor coupled to the second transistor and the third transistor. The integrated device includes a read word line located over the substrate, where the read word line is coupled to the third transistor. The integrated device includes a read bit line located over the substrate, where the read bit line is coupled to the third transistor. The integrated device includes an activation line located over the substrate, where the activation line is coupled to the second transistor. The memory bitcell may be configured to operate as a NAND memory bitcell. The memory bitcell may be configured to operate as a NOR memory bitcell. A binary value or a multi-bit value may be used to provide a pre-load value and/or an activation value to the memory bitcell. An integrated device may include several memory bitcells, and some of the memory bitcells may share a read bit line, a read word line and/or an activation line, which may help with reducing the overall size of all of the memory bitcells and the integrated device.

Exemplary Memory Bitcell with Pre-Load Voltage and Activation Voltage

Figure 1:
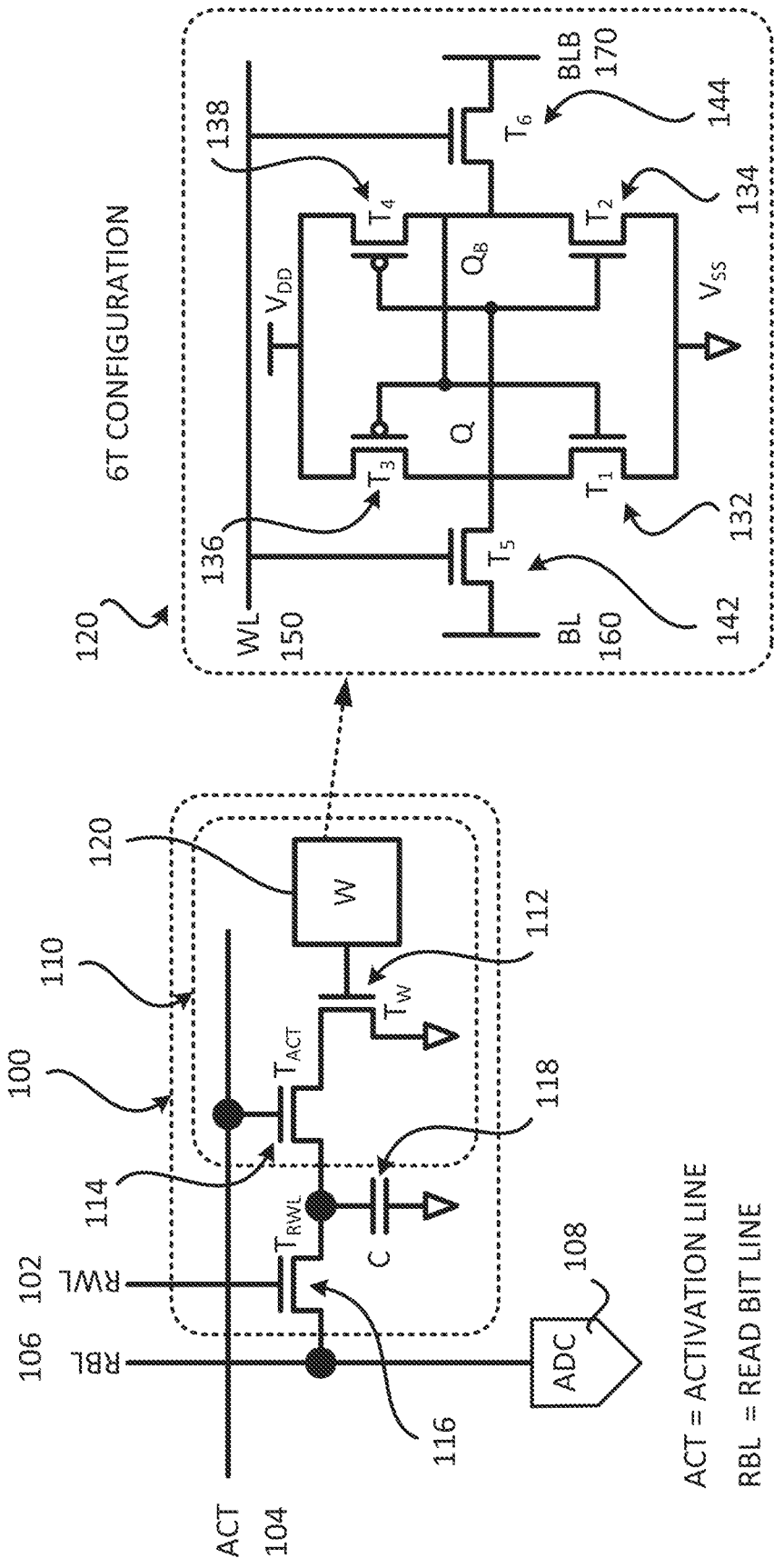
FIG. 1 illustrates a circuit diagram of a compute in memory (CIM) NAND bitcell.

FIG. 1 illustrates a circuit diagram of a memory bitcell 100 that is configured to perform a logic operation. The memory bitcell 100 is configured as a NAND gate to perform a NAND operation. The memory bitcell 100 may be a compute in memory (CIM) bitcell (e.g., CIM NAND bitcell). The memory bitcell 100 includes a pre-charge capability. The memory bitcell 100 may include a nine transistor (9T) and one capacitor (1C) memory bitcell. The memory bitcell 100 may be implemented in an integrated device. The memory bitcell 100 may be one memory bitcell from a plurality of memory bitcells in an integrated device. The memory bitcell 100 may be part of a memory circuit for an integrated device.

The memory bitcell 100 includes a six (6) transistor circuit configuration 120, a first transistor 112, a second transistor 114, a third transistor 116 and a capacitor 118. The first transistor 112 is coupled to the six-transistor circuit configuration 120. The second transistor 114 is coupled to the first transistor 112. The third transistor 116 is coupled to the second transistor 114. The capacitor 118 is coupled to the second transistor 114 and the third transistor 116. The first transistor 112, the second transistor 114 and the third transistor 116 may be coupled in series. The memory bitcell 100 also includes a read word line 102 (e.g., RWL) coupled to the third transistor 116, a read bit line 106 (e.g., RBL) coupled to the third transistor 116, and an activation line 104 coupled to second transistor 114. The read bit line 106 is coupled to the analog digital converter 108. One or more of the transistors (e.g., 112, 114, 116) may be means for transistor operation (e.g., first means for transistor operation, second means for transistor operation, third means for transistor operation, etc. . . . ). The capacitor 118 may be means for capacitance.

The six-transistor circuit configuration 120 includes a transistor 132, a transistor 134, a transistor 136, a transistor 138, a transistor 142, a transistor 144, a word line 150, a bit line 160, a bit line 170 (e.g., complement bit line). The transistor 136 and the transistor 138 may be P-type metal-oxide-semiconductor (PMOS) transistors. The transistor 132 and the transistor 134 may be N-type metal-oxide-semiconductor (NMOS) transistors. The transistor 132 and the transistor 136 may be configured as a first inverter. The transistor 134 and the transistor 138 may be configured as a second inverter. The six-transistor circuit configuration may be a six (6) transistor static random-access memory (SRAM). The six-transistor circuit configuration 120 may be means for transistor circuit operation.

The word line 150 is coupled to the transistor 142 and the transistor 144. The word line 150 may control the transistor 142 and the transistor 144. The transistor 142 is coupled to the bit line 160, and the transistor 144 is coupled to the bit line 170. A write operation of "1" may be performed by setting the word line 150 to be high (e.g., 1), which causes the transistor 142 and the transistor 144 to be "on" or activated. The bit line 160 is forced to be "1" and the bit line 170 is forced to be "0", which causes the value "1" to be stored. A write operation of "0" may be performed by setting the word line 150 to be high (e.g., 1), which causes the transistor 142 and the transistor 144 to be "on" or activated. The bit line 160 is forced to be "0" and the bit line 170 is forced to be "1", which causes the value "0" to be stored.

To perform a read operation, the bit line 160 and the bit line 170 may be pre-charged with $V_{dd}$. The word line 150 is activated (e.g., set to high, 1), which causes the transistor 142 and the transistor 144 to be "on" or activated. When the bit line 160 is "0" and the bit line 170 is "1", the value that is stored is "0". In at least one implementation, the value that is stored at the six-transistor circuit configuration 120 may be the value (or voltage) that is provided to the first transistor 112 to active or turn on the first transistor 112. The value (or voltage) that is provided by the six-transistor circuit configuration 120 may be the weighted value. The weighted value may be a binary value. The bit line 160 and/or the bit line 170 of the six-transistor circuit configuration 120, may be coupled (e.g., electrically coupled) to the first transistor 112, to provide the value (or voltage) to the first transistor 112.

The six-transistor circuit configuration 120, the first transistor 112 and the second transistor 114 may be configured to operate as an eight (8) transistor circuit configuration 110. The eight-transistor circuit configuration 110 may be an eight-transistor static random-access memory (SRAM). The operation of the memory bitcell 100 will be further described below.

Figure 2:
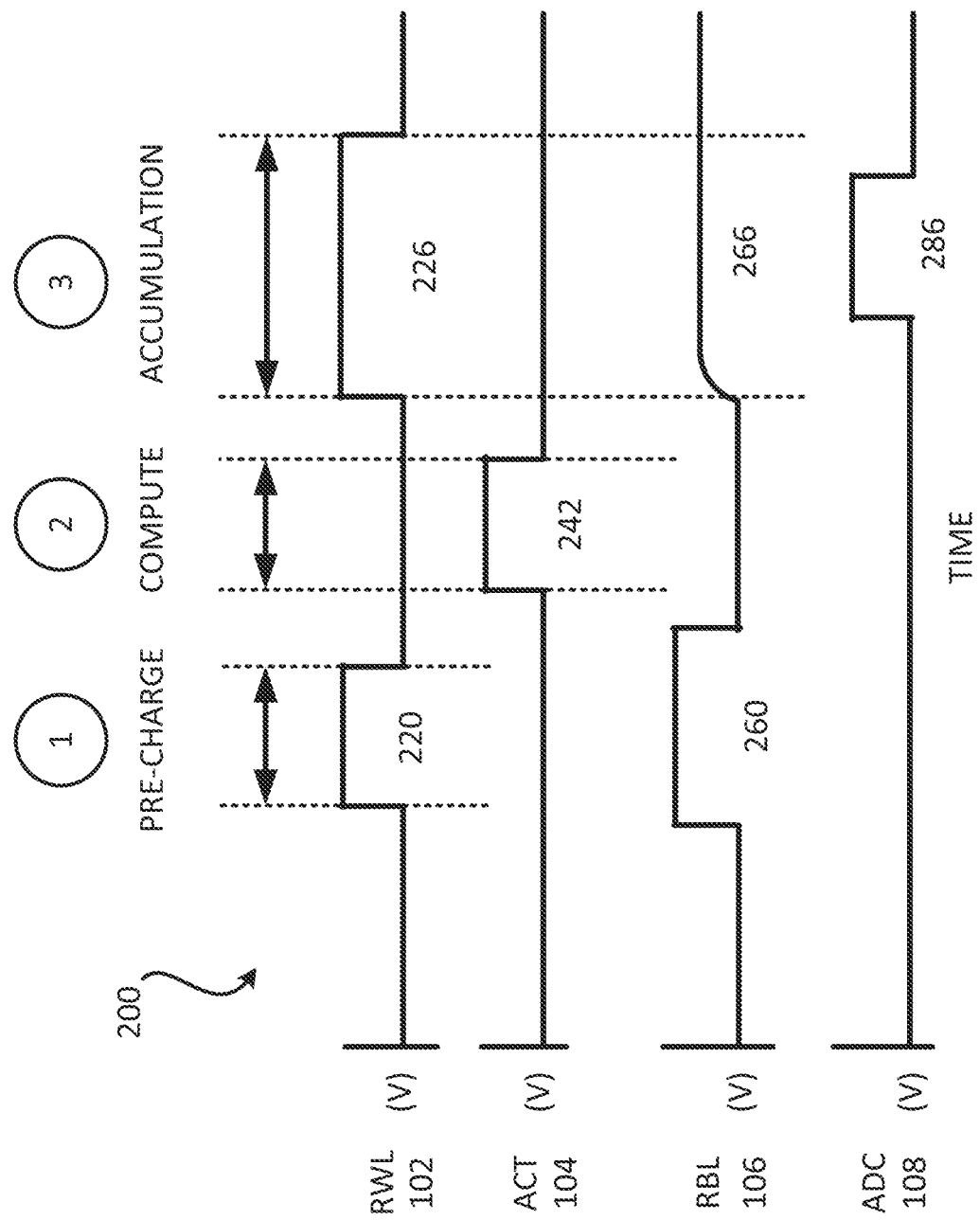
FIG. 2 illustrates voltage diagrams of different lines and components of a CIM bitcell through an operation.

FIG. 2 illustrates a diagram 200 that illustrates voltage values for various lines and components for the memory bitcell 100. However, as will be further described below, the diagram 200 may be applicable to other memory bitcells, such as the memory bitcell 500. FIG. 2 illustrates that in an operation of the memory bitcell, a pre-load control signal or pre-load control voltage 220 is applied at the read word bit line 102. A pre-load voltage 260 is applied at the read bit line. After pre-charge or pre-load is done, the pre-load control voltage 220 and the pre-load voltage 260 are turned off. In a computing phase, an activation voltage 242 is then applied at the activation line 104. After the computing phase, the activation voltage 242 is then turned off. In an accumulation phase, a control signal or voltage 226 is then applied at the read word line 102. This may cause accumulation of the voltage 266 at the read bit line 106. During the accumulation of the voltage 266 in the read bit line 106, the analog digital convertor (ADC) may have an input voltage 286 which may be caused by the voltage 266. The diagram 200 will be further described in detail below with respect to a memory bitcell 100.

Figure 3A:
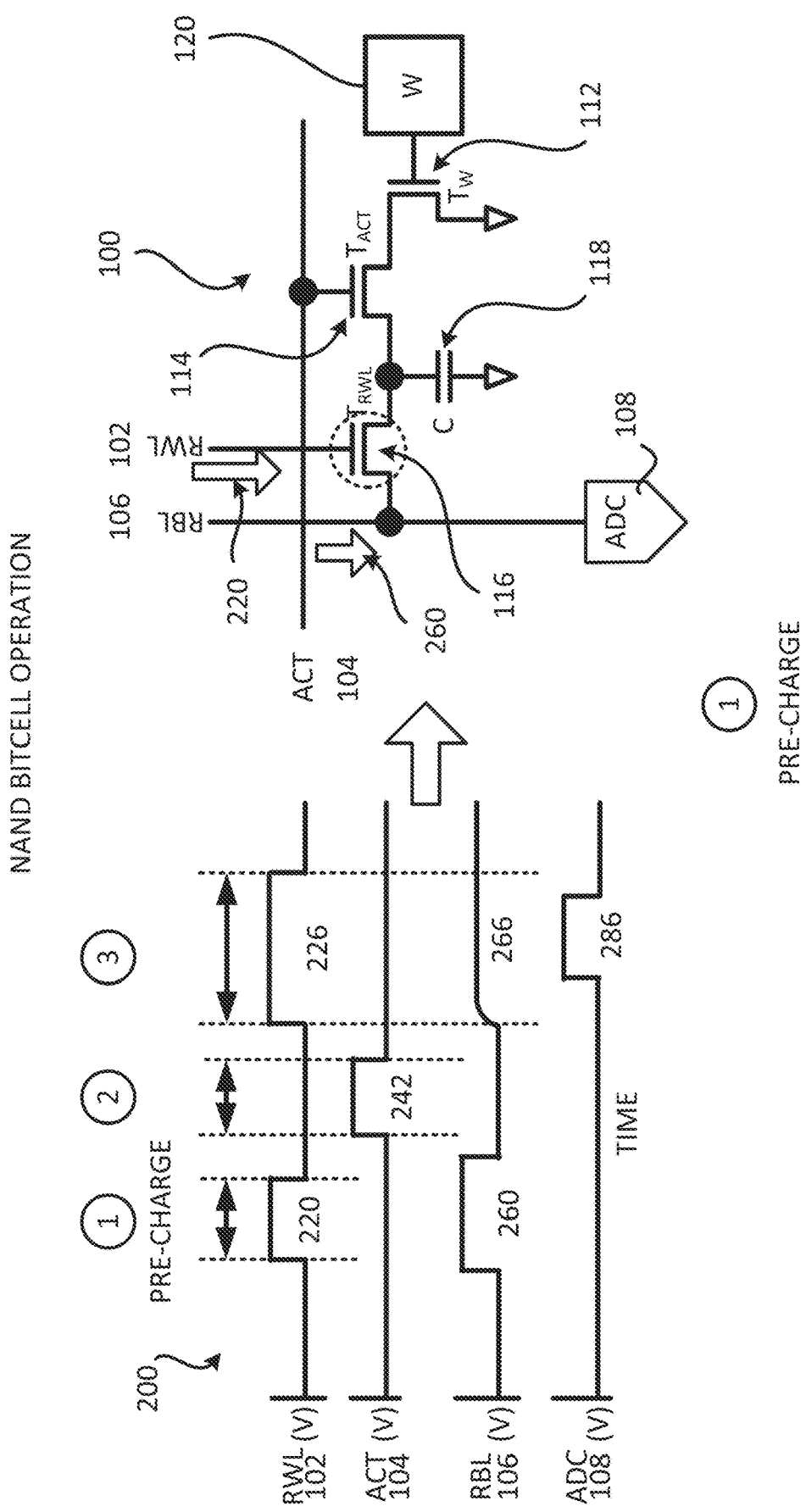
FIG. 3 (which includes FIGS. 3A-3C) illustrates a sequence of voltages across different lines and components during an operation of a CIM NAND bitcell.
Figure 3B:
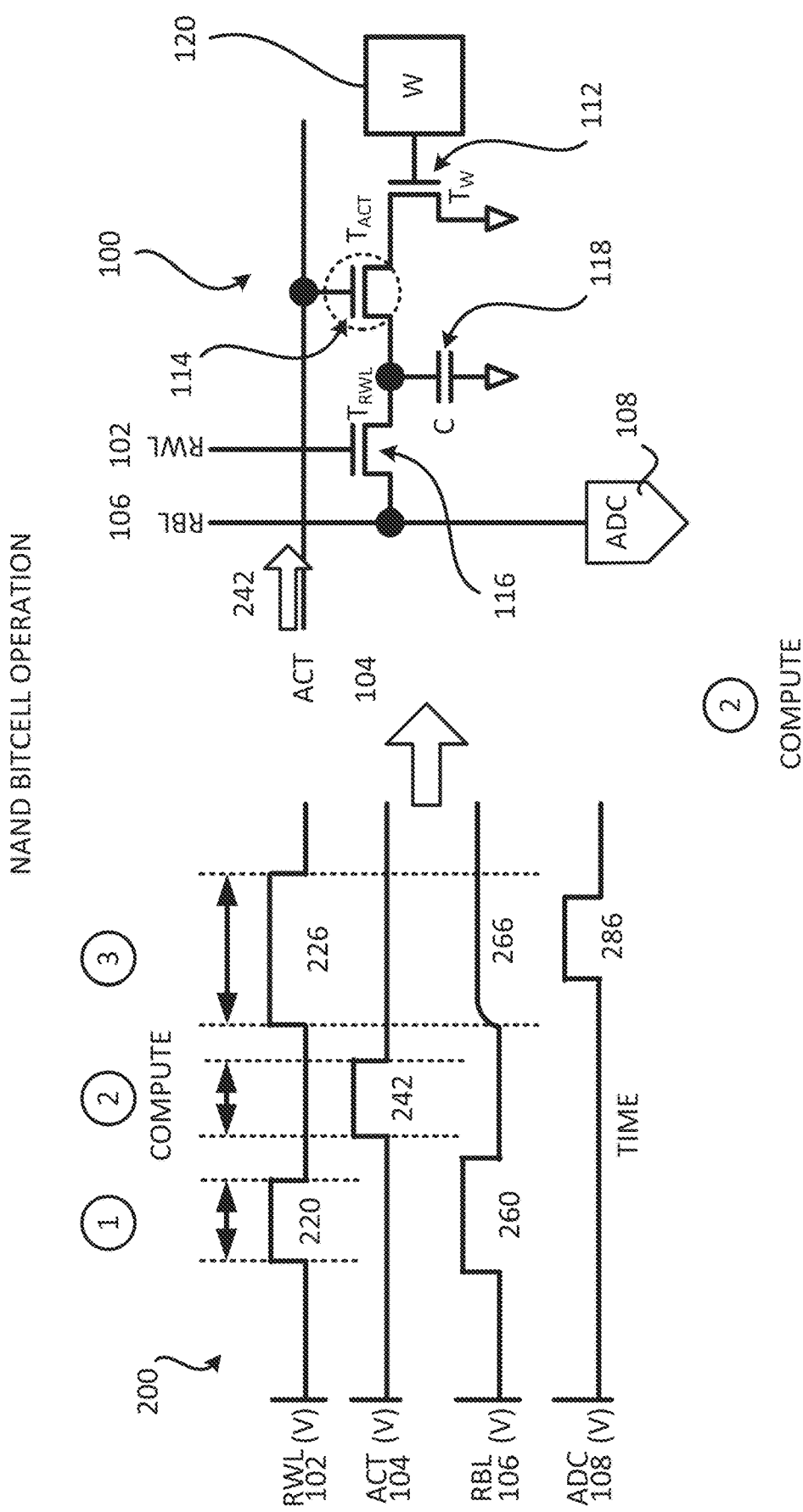
Figure 3C:
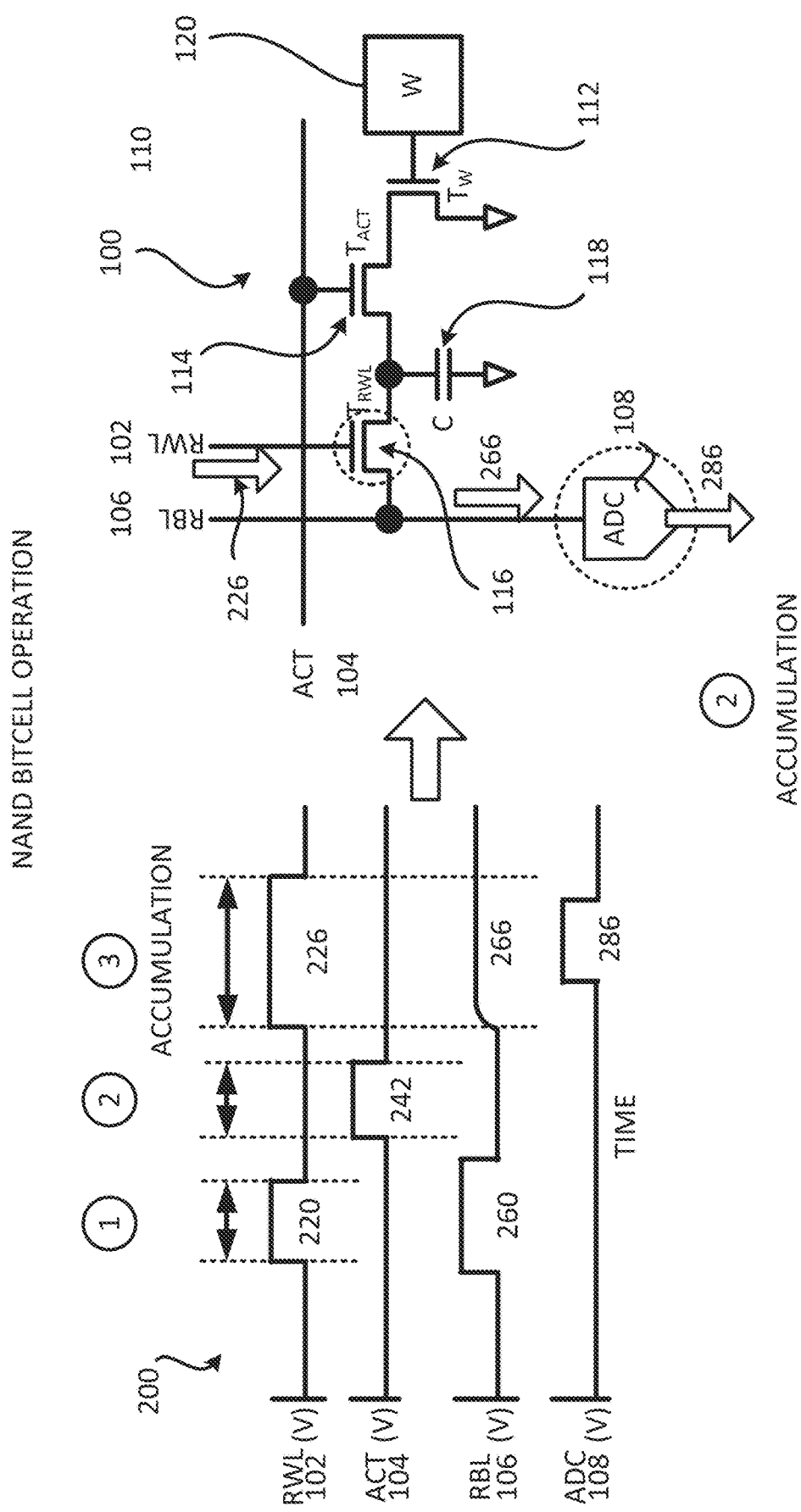

FIG. 3 (which includes FIGS. 3A-3C) illustrates an exemplary sequence of how the memory bitcell 100 may operate to read and/or write data. Stage 1 of FIG. 3A illustrates a state after a signal or voltage 220 is provided (e.g., applied) at the read word line 102. Stage 1 may be a pre-charge state of the memory bitcell 100. The signal or voltage 220 may be a pre-load control signal or pre-load control voltage that is applied at the read word line 102. The voltage 220 may cause the third transistor 116 to activate (e.g., turn on). The pre-load voltage 260 is provided (e.g., applied) at the read bit line 106, which causes the capacitor 118 to have a charge (e.g., pre-charge) because the third transistor 116 is activated due to the voltage 220. As will be further described below in at least FIGS. 8, 10 and 12, the voltage 260 or pre-load voltage may be used in binary format (e.g., 0 or 1) or may be used in a multi-bit format.

Stage 2 of FIG. 3B illustrates a state after the activation voltage 242 is provided (e.g., applied) at the activation line 104. The activation voltage 242 may provide an activation value. As will be further describe below, the activation value may be a binary activation value or a multi-bit activation value. Stage 2 may be a compute state or computer phase of the memory bitcell 100. The activation voltage 242 may be considered an input voltage. The activation voltage 242 may activate (e.g., turn on) the second transistor 114. Depending on the state of the six-transistor circuit configuration 120 (which is a weighted value), the activation voltage 242 may cause the value of the capacitor 118 to change. A current from the capacitor 118 may flow through the second transistor 114 and the first transistor 112, when the voltage (or value) by the six-transistor circuit configuration 120 to active (e.g., turn on) the first transistor 112. In at least one implementation, when the first transistor 112 is not activated, the charge at the capacitor 118 may remain relatively the same. As will be further described below in at least FIGS. 8, 10 and 12, the activation voltage 242 may be used in a binary format (e.g., 0 or 1) or may be used in a multi-bit format.

Stage 3 of FIG. 3C illustrates a state after a voltage 226 is provided (e.g., applied) at the read word bit line 102. Stage 3 may be an accumulation state or accumulation phase of the memory bitcell 100. The voltage 226 may cause the third transistor 116 to active or turn on, and cause the voltage 266 at the read bit line 106. The charge stored at the capacitor 118 may cause the voltage 266 at the read bit line 106. If there is no charge stored at the capacitor 118, there may not be a voltage 266 at the read bit line 106. The voltage 266 at the read bit line 106 is provided to the ADC 108, which results in a voltage 286 at the ADC 108.

Figure 8:
FIG. 8 illustrates a table for a NAND bitcell with binary pre-load voltage and binary activation voltage.
Figure 10:
FIG. 10 illustrates a table for a NAND bitcell with multi-bit pre-load voltage and binary activation voltage.

FIGS. 8, 10 and 12 illustrate exemplary tables with different pre-load voltages, activation voltages and weighted values for the memory bitcell 100.

Exemplary Array of Memory Bitcells

Figure 4:
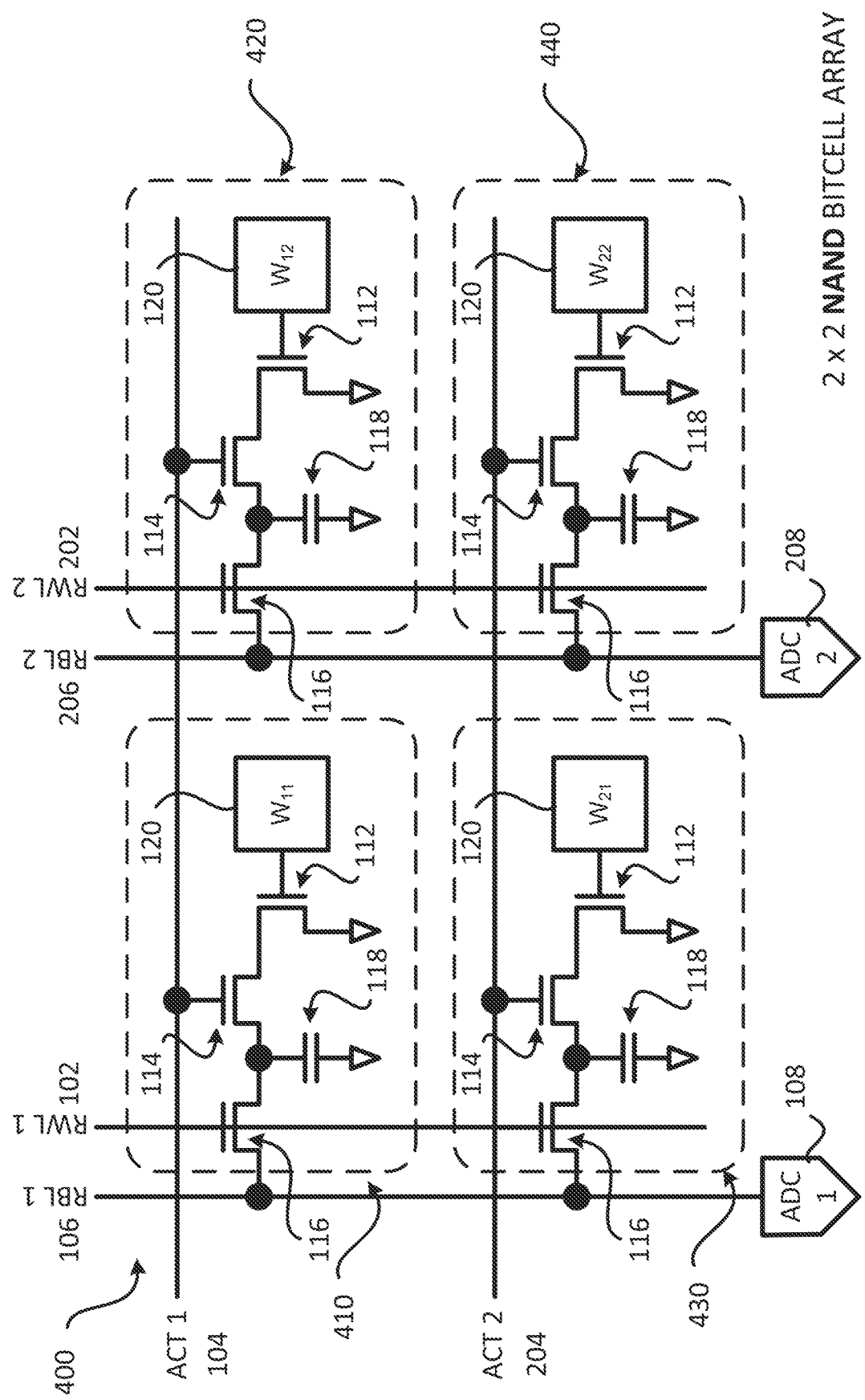
FIG. 4 illustrates a circuit diagram of a 2 by 2 array of a compute in memory (CIM) NAND bitcell.

FIG. 4 illustrates an array 400 of memory bitcells. The array 400 includes a first memory bitcell 410, a second memory bitcell 420, a third memory bitcell 430, and a fourth memory bitcell 440. The array 400 is a 2×2 array of memory bitcells. However, different implementations may have an array with different numbers of memory bitcells. Each of the first memory bitcell 410, the second memory bitcell 420, the third memory bitcell 430, and the fourth memory bitcell 440, may be the memory bitcell 100. The array 400 may be implemented in an integrated device. The array 400 may be part of a memory circuit for an integrated device. An integrated device may include a plurality of the array 400.

The array 400 includes a first read word bit line 102, a second read word bit line 202, a first read bit line 106, a second read bit line 206, a first activation line 104 and a second activation line 204. As shown in FIG. 4, some of the memory bitcells (e.g., 410, 420, 430, 440) may share a read bit line, a read word bit line, an activation line and/or and ADC.

The first read word bit line 102 is coupled to the first memory bitcell 410 and the third memory bitcell 430. The first read bit line 106 is coupled to the first memory bitcell 410 and the third memory bitcell 430. The first read bit line 106 is coupled to the first ADC 108. The second read word bit line 202 is coupled to the second memory bitcell 420 and the fourth memory bitcell 440. The second read bit line 206 is coupled to the second memory bitcell 420 and the fourth memory bitcell 440. The second read bit line 206 is coupled to the second ADC 208. The first activation line 104 is coupled to the first memory bitcell 410 and the second memory bitcell 420. The second activation line 204 is coupled to the third memory bitcell 430 and the fourth memory bitcell 440.

As shown in FIG. 4, the first memory bitcell 410, the second memory bitcell 420, the third memory bitcell 430, and the fourth memory bitcell 440, each includes (i) a six-transistor circuit configuration 120, (ii) a first transistor 112 coupled to the six-transistor circuit configuration 120, (iii) a second transistor 114 coupled to the first transistor 112, (iv) a third transistor 116 coupled to the second transistor 114, and (v) a capacitor 118 coupled to the second transistor 114 and the third transistor 116. The first read word line 102 is coupled to the third transistor 116 of the first memory bitcell 410 and the third transistor 116 of the third memory bitcell 430. The first read bit line 106 is coupled to the third transistor 116 of the first memory bitcell 410 and the third transistor 116 of the third memory bitcell 430. The first activation line 104 is coupled to the second transistor 114 of the first memory bitcell 410 and the second transistor 114 of the second memory bitcell 420. The second read word line 202 is coupled to the third transistor 116 of the second memory bitcell 420 and the third transistor 116 of the fourth memory bitcell 440. The second read bit line 206 is coupled to the third transistor 116 of the second memory bitcell 420 and the third transistor 116 of the fourth memory bitcell 440. The second activation line 204 is coupled to the second transistor 114 of the third memory bitcell 430 and the second transistor 114 of the fourth memory bitcell 440.

In some implementations, when an activation voltage is applied to the activation line 104, the activation voltage may be provided to the first memory bitcell 410 and the second memory bitcell 420. In some implementations, when an activation voltage is applied to the activation line 204, the activation voltage may be provided to the third memory bitcell 430 and the fourth memory bitcell 440.

In some implementations, when a pre-load control voltage is applied at the read word bit line 102, the pre-load voltage may be provided to the first memory bitcell 410 and the third memory bitcell 430. In some implementations, when a pre-load control voltage is applied at the read word bit line 202, the pre-load voltage may be provided to the second memory bitcell 420 and the fourth memory bitcell 440. In at least some implementations, the read word bit line 102 and the read word bit line 202 may be part of the same read word bit line for the circuit. For example, a voltage that is applied to the first read word bit line 102 may also be applied to the second read word bit line 202, and vice versa. The read word bit line 102 may be coupled to the read word bit line 202.

In some implementations, a voltage that is present at the read bit line 106 may be affected by the first memory bitcell 410 and the third memory bitcell 430. In some implementations, a voltage that is present at the read bit line 206 may be affected by the second memory bitcell 420 and the fourth memory bitcell 440.

The operation of the array 400 that includes the memory bitcells (e.g., 410, 420, 430, 440) may operate in a similar manner as the memory bitcell 100 as described in FIGS. 3A-3C. The memory bitcells of the array 400 may share bit read lines, bit word lines and activation lines, and as such, voltages applied at various lines may activate (e.g., turn on) more than one transistor from different memory bitcells at a time.

Exemplary Memory Bitcell with Pre-Load Voltage and Activation Voltage

Figure 5:
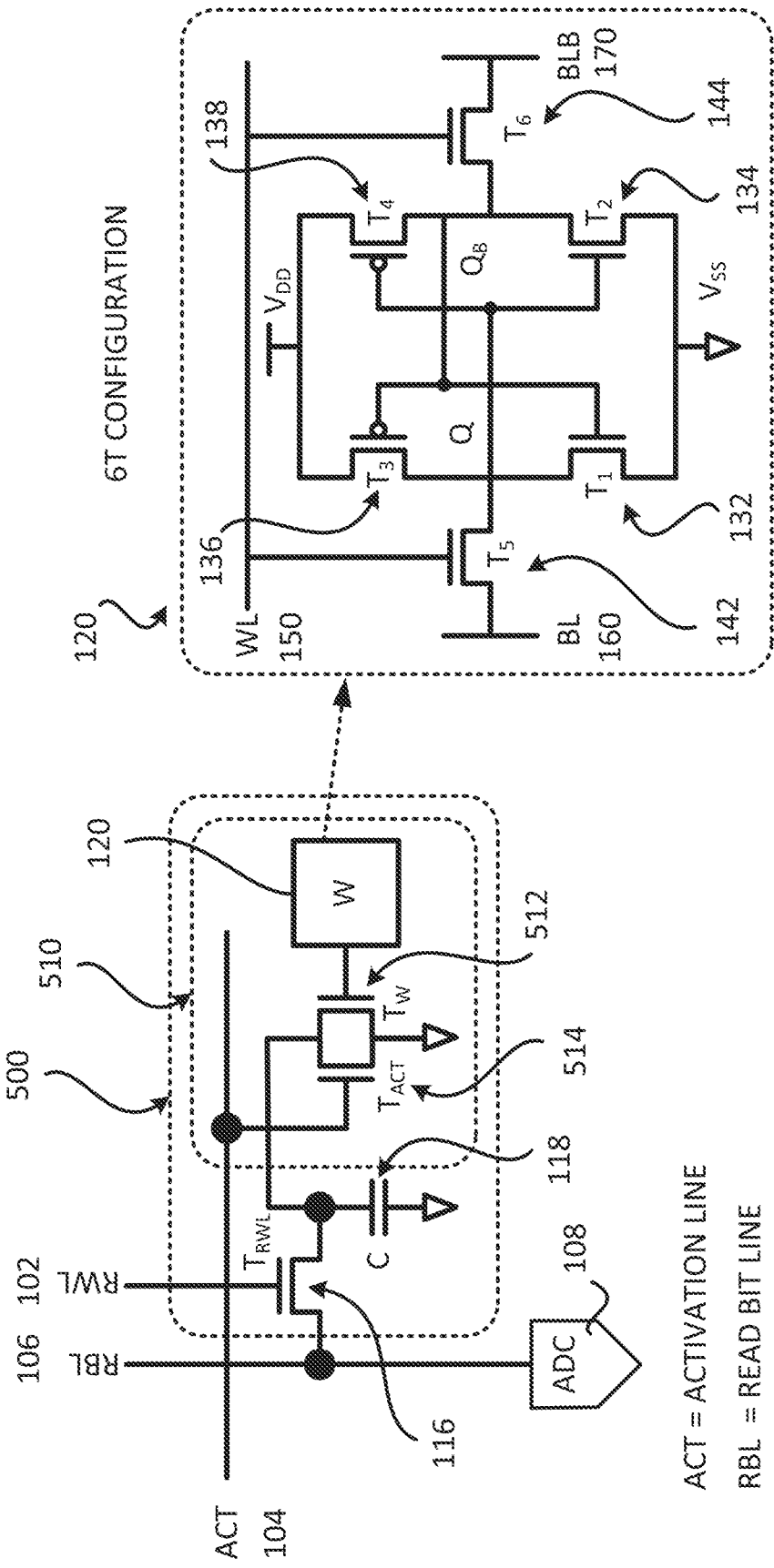
FIG. 5 illustrates a circuit diagram of a compute in memory (CIM) NOR bitcell.

FIG. 5 illustrates a circuit diagram of a memory bitcell 500 that is configured to perform a logic operation. The memory bitcell 500 is configured as a NOR gate to perform a NOR operation. The memory bitcell 500 may be a compute in memory (CIM) bitcell (e.g., CIM NOR bitcell). The memory bitcell 500 includes a pre-charge capability. The memory bitcell 500 may include a nine transistor (9T) and one capacitor (1C) memory bitcell. The memory bitcell 500 may be implemented in an integrated device. The memory bitcell 500 may be part of a memory circuit for an integrated device. The memory bitcell 500 may be one bitcell from a plurality of memory bitcells in an integrated device.

The memory bitcell 500 includes the six (6) transistor circuit configuration 120, a first transistor 512, a second transistor 514, a third transistor 116 and a capacitor 118. The first transistor 512 is coupled to the six-transistor circuit configuration 120. The second transistor 514 is coupled to the first transistor 512. The first transistor 512 and the second transistor 514 may be coupled in parallel. The third transistor 116 is coupled to the second transistor 514. The capacitor 118 is coupled to the second transistor 514 and the third transistor 116. The memory bitcell 500 also includes a read word line 102 coupled to the third transistor 116, a read bit line 106 coupled to the third transistor 116, and an activation line 104 coupled to second transistor 514. The read bit line 106 is coupled to the analog digital converter 108. One or more of the transistors (e.g., 512, 514, 116) may be means for transistor operation (e.g., first means for transistor operation, second means for transistor operation, third means for transistor operation). The capacitor 118 may be means for capacitance.

The six-transistor circuit configuration 120 includes the transistor 132, a transistor 134, the transistor 136, the transistor 138, the transistor 142, the transistor 144, the word line 150, the bit line 160, and the bit line 170 (e.g., complement bit line). The operation of the six-transistor circuit configuration 120 is similar to the operation of the six-transistor circuit configuration 120 described for the memory bitcell 100.

Figure 6A:
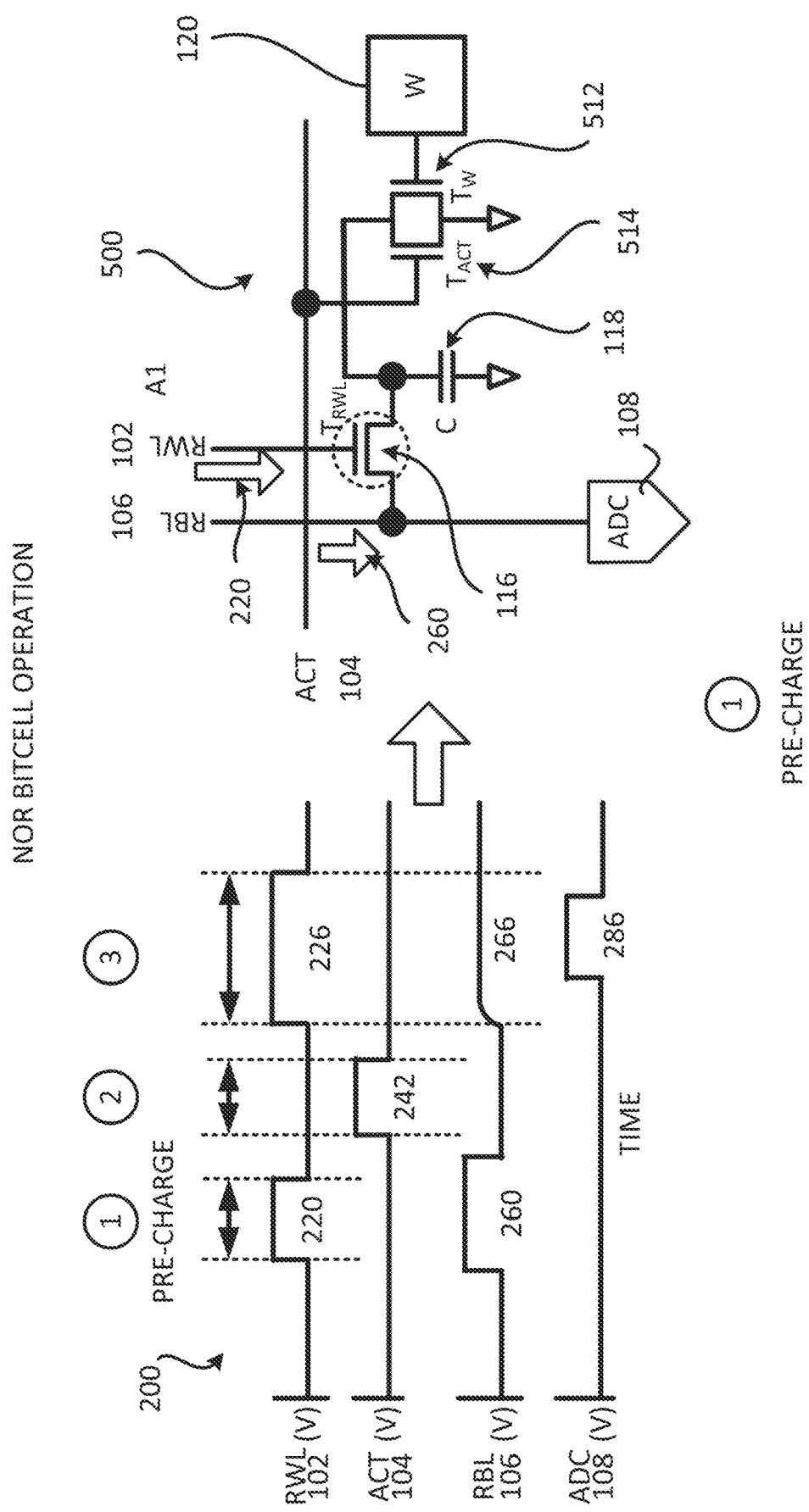
FIG. 6 (which includes FIGS. 6A-6C) illustrates a sequence of how different elements of a CIM NOR bitcell may operate.
Figure 6B:
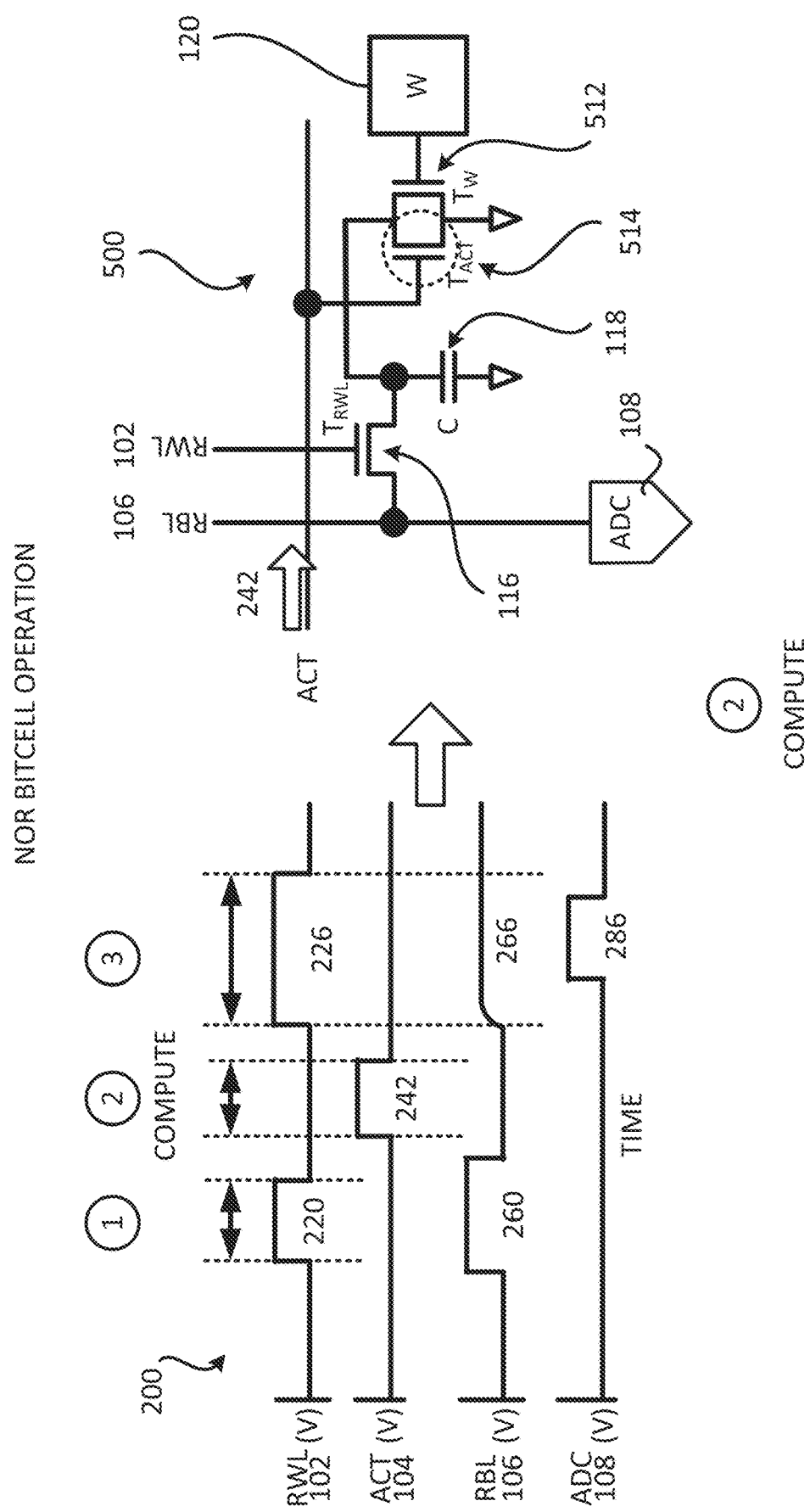
Figure 6C:
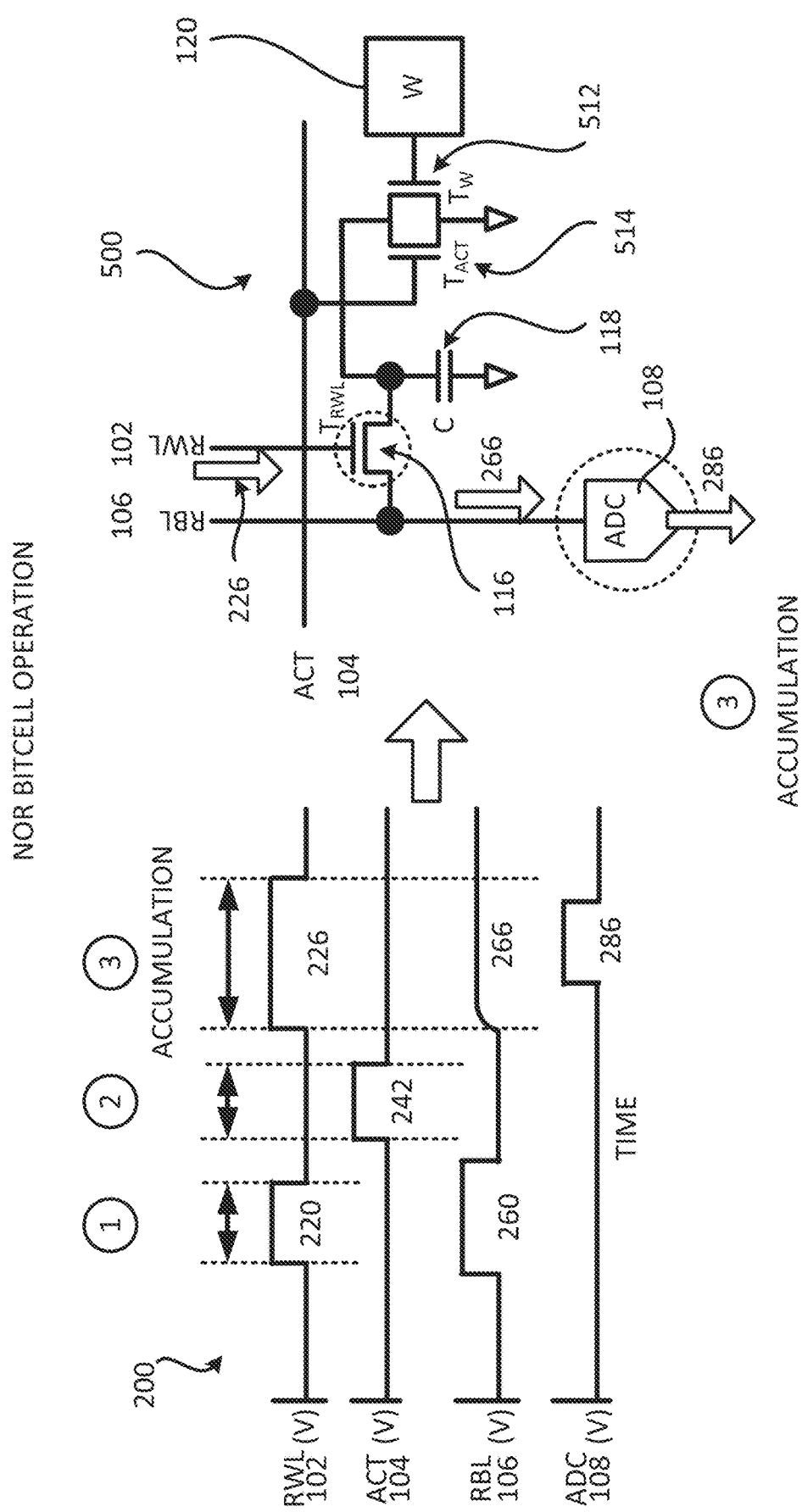

FIG. 6 (which includes FIGS. 6A-6C) illustrates an exemplary sequence of how the memory bitcell 500 may operate to read and/or write data. Stage 1 of FIG. 6A illustrates a state after a signal or voltage 220 is provided (e.g., applied) at the read word line 102. Stage 1 may be a pre-charge state of the memory bitcell 500. The voltage 220 may be a pre-load voltage that is applied at the read word line 102. The voltage 220 may cause the third transistor 116 to activate (e.g., turn on). The pre-load voltage 260 is provided (e.g., applied) at the read bit line 106, which causes the capacitor 118 to have a charge (e.g., pre-charge) because the third transistor 116 is activated due to the voltage 220. In at least one implementation, depending on the state of the six-transistor circuit configuration 120 (which is a weighted value), the first transistor 512 may be active (e.g., turn on). In such an instance, no charge may be stored at the capacitor 118. If the first transistor 512 is not active (e.g., turn off), the pre-load voltage 260 may result in the capacitor 118 to have a charge (e.g., pre-charge). As will be further described below in at least FIGS. 9, 11 and 13, the voltage 260 or pre-load voltage may be used in a binary format (e.g., 0 or 1) or may be used in a multi-bit format.

Stage 2 of FIG. 6B illustrates a state after the activation voltage 242 is provided (e.g., applied) at the activation line 104. The activation voltage 242 may provide an activation value. The activation value may be a binary activation value or a multi-bit activation value. Stage 2 may be a compute state or compute phase of the memory bitcell 500. The activation voltage 242 may be considered an input voltage. The activation voltage 242 may activate (e.g., turn on) the second transistor 514. Depending on the state of the six-transistor circuit configuration 120 (which is a weighted value), the activation voltage 242 may cause the value of the capacitor 118 to change. A current from the capacitor 118 may flow through the second transistor 514 and/or the first transistor 512 (when the voltage (or value) by the six-transistor circuit configuration 120 to active (e.g., turn on) the first transistor 512). In at least one implementation, when the first transistor 112 is not activated, the charge at the capacitor 118 may remain relatively the same. As will be further described below in at least FIGS. 9, 11 and 13, the activation voltage 242 may be used in a binary format (e.g., 0 or 1) or may be used in a multi-bit format.

Figure 9:
FIG. 9 illustrates a table for a NOR bitcell with binary pre-load voltage and binary activation voltage.
Figure 11:
FIG. 11 illustrates a table for a NOR bitcell with multi-bit pre-load voltage and binary activation voltage.

Stage 3 of FIG. 6C illustrates a state after a voltage 226 is provided (e.g., applied) at the read word bit line 102. Stage 3 may be an accumulation state or accumulation phase of the memory bitcell 100. The voltage 226 may cause the third transistor 116 to active (e.g., turn on), and cause the voltage 266 at the read bit line 106. The energy (e.g., charge, voltage) stored at the capacitor 118 may cause the voltage 266 at read bit line. If there is no energy stored at the capacitor 118, there may not be a voltage 266. The voltage 266 at the read bit line 106 is provided to the ADC 108, which results in a voltage 286 at the ADC 108. FIGS. 9, 11 and 13 illustrate exemplary tables with different pre-load voltages, activation voltages and weighted values for the memory bitcell 500.

Exemplary Array of Memory Bitcells

Figure 7:
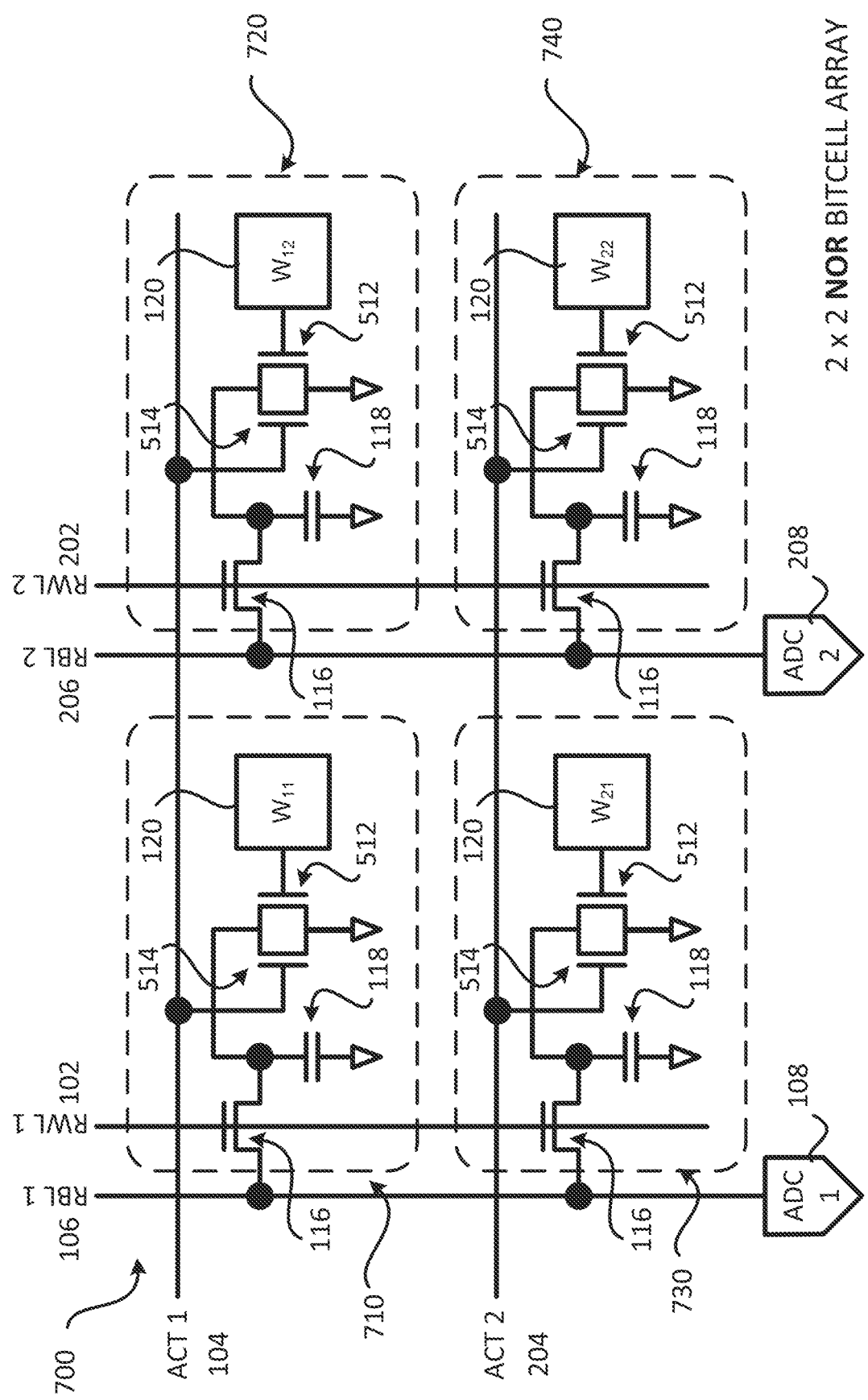
FIG. 7 illustrates a circuit diagram of a 2 by 2 array of a compute in memory (CIM) NOR bitcell.

FIG. 7 illustrates an array 700 of memory bitcells. The array 700 includes a first memory bitcell 710, a second memory bitcell 720, a third memory bitcell 730, and a fourth memory bitcell 740. The array 700 is a 2×2 array of memory bitcells. However, different implementations may have an array with different numbers of memory bitcells. Each of the first memory bitcell 710, the second memory bitcell 720, the third memory bitcell 730, and the fourth memory bitcell 740, may be the memory bitcell 500. The array 700 may be implemented in an integrated device. The array 700 may be part of a memory circuit for an integrated device. An integrated device may include a plurality of the array 700.

The array 700 includes a first read word line 102, a second read word line 202, a first read bit line 106, a second read bit line 206, a first activation line 104 and a second activation line 204. As shown in FIG. 7, some of the memory bitcells (e.g., 710, 720, 730, 740) may share a read bit line, a read word line, an activation line and/or and ADC. In at least some implementations, the read word bit line 102 and the read word bit line 202 may be part of the same read word bit line for the circuit. For example, a voltage that is applied to the first read word bit line 102 may also be applied to the second read word bit line 202, and vice versa. The read word bit line 102 may be coupled to the read word bit line 202.

The first read word line 102 is coupled to the first memory bitcell 710 and the third memory bitcell 730. The first read bit line 106 is coupled to the first memory bitcell 710 and the third memory bitcell 730. The first read bit line 106 is coupled to the first ADC 108. The second read word line 202 is coupled to the second memory bitcell 720 and the fourth memory bitcell 740. The second read bit line 206 is coupled to the second memory bitcell 720 and the fourth memory bitcell 740. The second read bit line 206 is coupled to the second ADC 208. The first activation line 104 is coupled to the first memory bitcell 710 and the second memory bitcell 720. The second activation line 204 is coupled to the third memory bitcell 730 and the fourth memory bitcell 740.

As shown in FIG. 7, the first memory bitcell 710, the second memory bitcell 720, the third memory bitcell 730, and the fourth memory bitcell 740, each includes (i) a six-transistor circuit configuration 120, (ii) a first transistor 512 coupled to the six-transistor circuit configuration 120, (iii) a second transistor 514 coupled to the first transistor 512, (iv) a third transistor 116 coupled to the second transistor 514, and (v) a capacitor 118 coupled to the second transistor 514 and the third transistor 116. The first read word line 102 is coupled to the third transistor 116 of the first memory bitcell 710 and the third transistor 116 of the third memory bitcell 730. The first read bit line 106 is coupled to the third transistor 116 of the first memory bitcell 710 and the third transistor 116 of the third memory bitcell 730. The first activation line 104 is coupled to the second transistor 514 of the first memory bitcell 710 and the second transistor 514 of the second memory bitcell 720. The second read word line 202 is coupled to the third transistor 116 of the second memory bitcell 720 and the third transistor 116 of the fourth memory bitcell 740. The second read bit line 206 is coupled to the third transistor 116 of the second memory bitcell 720 and the third transistor 116 of the fourth memory bitcell 740. The second activation line 204 is coupled to the second transistor 514 of the third memory bitcell 730 and the second transistor 514 of the fourth memory bitcell 740.

In some implementations, when an activation voltage is applied to the activation line 104, the activation voltage may be provided to the first memory bitcell 710 and the second memory bitcell 720. In some implementations, when an activation voltage is applied to the activation line 204, the activation voltage may be provided to the third memory bitcell 730 and the fourth memory bitcell 740.

In some implementations, when a pre-load voltage is applied at the read word line 102, the pre-load voltage may be provided to the first memory bitcell 710 and the third memory bitcell 730. In some implementations, when a pre-load voltage is applied at the read word line 202, the pre-load voltage may be provided to the second memory bitcell 720 and the fourth memory bitcell 740.

In some implementations, a voltage that is present at the read bit line 106 may be affected by the first memory bitcell 710 and the third memory bitcell 730. In some implementations, a voltage that is present at the read bit line 206 may be affected by the second memory bitcell 720 and the fourth memory bitcell 740.

The operation of the array 700 that includes the memory bitcells (e.g., 710, 720, 730, 740) may operate in a similar manner as the memory bitcell 500 as described in FIGS. 6A-6C. The memory bitcells of the array 700 may share bit read lines, bit word lines and activation lines, and as such, voltages applied at various lines may activate (e.g., turn on) more than one transistor from different memory bitcells at a time.

An integrated device may include a plurality of bitcells 100, a plurality of array 400, a plurality of the bitcells 500, a plurality of the array 700, and/or combinations thereof.

Memory Bitcell Using Binary Value and Multi-Bit Value

Having described various operations of various memory bitcells. Examples of the values that may be generated by the various memory bitcells will be described below. As mentioned above, the value that are used in the memory bitcells (e.g. 100, 500) may include a binary value (e.g., 0, 1) or a multi-bit value. A binary value may be a pre-load binary value or binary pre-load value. A multi bit value may include a multi-bit pre-load value.

FIG. 8 illustrates a table 800 of the memory bitcell 100 that is configured to operate as a NAND memory bitcell. Table 800 illustrates exemplary values for a binary pre-load voltage (e.g., 260), a binary pre-load activation voltage (e.g., 242) and a binary weighted value (or weighted voltage) at the transistor circuit configuration 120, value at the capacitor 118, and value at the read bit line 106. A binary value in this implementation means that the value can be either 1 or 0, with the $V_{dd}$ value being equal to 1. However, the $V_{dd}$ value may be different. As an example, when the pre-load voltage 260 is equal to 1, the binary pre-load value is 1. When the pre-load voltage 260 is equal to 1, the activation voltage 242 is equal to 1 and the binary weight is equal to 0 (from the circuit configuration 120) from the waveform sequence, the voltage at the capacitor 118 is 1 and the voltage at the read bit line 106 is 1. This means that in this example, a charge or a voltage is stored at the capacitor 118, and thus a charge or a voltage is provided at the read bit line 106 at the accumulation stage.

FIG. 9 illustrates a table 900 of the memory bitcell 500 that is configured to operate as a NOR memory bitcell. Table 900 illustrates exemplary values for a binary pre-load voltage (e.g., 260), a binary pre-load activation voltage (e.g., 242) and a binary weighted value (or weighted voltage) at the transistor circuit configuration 120, value at the capacitor 118, and value at the read bit line 106. A binary value in this implementation means that the value can be either 1 or 0, with the $V_{dd}$ value being equal to 1. However, the $V_{dd}$ value may be different. As an example, when the pre-load voltage 260 is equal to 1, the binary pre-load value is 1. When the read word line 102 is equal to 1, the activation voltage 242 is equal to 1 and the binary weight is equal to 0 (from the circuit configuration 120) from a waveform sequence, the voltage at the capacitor 118 is 0, and there is no charge or no voltage at the read bit line 106 (e.g., 0) at accumulation stage. This means that in this example, no charge or voltage is stored at the capacitor 118, and thus no charge nor voltage is provided at the read bit line 106.

FIG. 10 illustrates a table 1000 of the memory bitcell 100 that is configured to operate as a NAND memory bitcell. Table 1000 illustrates exemplary values for a multi bit pre-load voltage (e.g., using voltage 260), a binary activation voltage (e.g., 242), a binary weighted value (or weighted voltage) at the transistor circuit configuration 120, a value at a capacitor 118, and a value at read bit line 106. A multi-bit value in this implementation means that the value/level can be more than 1 or 0. In a multi-bit environment, the range of values can be arbitrary set. In this example, the multi-bit environment for the pre-load value is set at 256 level (if it is 8 bits). That means, that the pre-load value may have a value/level between 0 and 255. However, different implementations may use different ranges of bit values/levels (e.g., 7 bits for 128 levels). In this example, the $V_{dd}$ value is equal to 1. However, the $V_{dd}$ value may be different. As an example, when the pre-load voltage 260 is equal to about 0.51V, the pre-load value/level may be 130. When the pre-load voltage 260 is equal to 0.51V, the activation voltage 242 is equal to 1 and the binary weight is equal to 0 (from the circuit configuration 120), the voltage at the capacitor 118 is 0.508V and the voltage at the read bit line 106 is 0.508V. This means that in this example, a charge or voltage is stored at the capacitor 118, and thus a charge or voltage is provided at the read bit line 106. In at least some implementations, when the binary weight is 1 (at the circuit configuration 120), then the capacitor voltage will be 0 (at the capacitor 118) and the voltage (e.g., RBL output) will be 0 (at the read bit line 106).

FIG. 11 illustrates a table 1100 of the memory bitcell 500 that is configured to operate as a NOR memory bitcell. Table 1100 illustrates exemplary values for a multi bit pre-load voltage (e.g., using voltage 260), a binary activation voltage (e.g., 242), a binary weighted value (or weighted voltage) at the transistor circuit configuration 120, a value at a capacitor 118, and a value at read bit line 106. A multi-bit value in this implementation means that the value/level can be more than 1 or 0. In a multi-bit environment, the range of values/levels can be arbitrary set. In this example, the multi-bit environment for the pre-load value is set at 8 bits/256 levels. That means, that the pre-load value/level may have a value/level between 0 and 255. However, different implementations may use different ranges of bit values/levels (e.g., 7 bits for 128 levels). In this example, the $V_{dd}$ value is equal to 1. However, the $V_{dd}$ value may be different. As an example, when the pre-load voltage 260 is equal to about 0.51V, the pre-load value/level may be 130. When the pre-load voltage 260 is equal to 0.51V, the activation voltage 242 is equal to 1 and the binary weight is equal to 0 (from the circuit configuration 120), the voltage at the capacitor 118 is 0 and the charge or voltage at the read bit line 106 is 0. This means that in this example, no charge nor voltage is stored at the capacitor 118, and thus no charge nor voltage is provided at the read bit line 106.

FIG. 12 illustrates a table 1200 of the memory bitcell 100 that is configured to operate as a NAND memory bitcell. Table 1200 illustrates exemplary values for a multi bit pre-load voltage (e.g., using voltage 260), a binary activation voltage (e.g., 242), a binary weighted value (or weighted voltage) at the transistor circuit configuration 120, a value at a capacitor 118, and a value at read bit line 106. A multi-bit value in this implementation means that the value/level can be more than 1 or 0. In a multi-bit environment, the range of values/levels can be arbitrary set. In this example, the multi-bit environment for the pre-load value is set at 8 bits/256 levels. That means, that the pre-load value may have a value/level between 0 and 255. However, different implementations may use different ranges of bit values (e.g., 7 bits/128 levels). Similarly, the multi-bit environment for the activation value/level may be 8 bits/256 levels. In this example, the $V_{dd}$ value is equal to 1. However, the $V_{dd}$ value may be different. As an example, when the pre-load voltage 260 is equal to about 0.51V, the pre-load value/level may be 130. When the pre-load voltage 260 is equal to 0.51V, the activation voltage 242 is equal to 0.5078 (130 level) and the binary weight is equal to 1 (from the circuit configuration 120), the voltage at the capacitor 118 is 0.258V and the voltage at the read bit line 106 is 0.258V. This means that in this example, a charge or voltage is stored at the capacitor 118, and thus a charge/voltage is provided at the read bit line 106.

FIG. 13 illustrates a table 1300 of the memory bitcell 500 that is configured to operate as a NOR memory bitcell. Table 1300 illustrates exemplary values for a multi bit pre-load voltage (e.g., using voltage 260), a binary activation voltage (e.g., 242), a binary weighted value (or weighted voltage) at the transistor circuit configuration 120, a value at a capacitor 118, and a value at read bit line 106. A multi-bit value in this implementation means that the value/level can be more than 1 or 0. In a multi-bit environment, the range of values/levels can be arbitrary set. In this example, the multi-bit environment for the pre-load value is set at 8 bits/256 levels. That means, that the pre-load value/level may have a value/level between 0 and 255. However, different implementations may use different ranges of bit values (e.g., 7 bits/128 levels). Similarly, the multi-bit environment for the activation value/level may be 8 bits/256 levels. In this example, the $V_{dd}$ value being equal to 1. However, the $V_{dd}$ value may be different. As an example, when the pre-load voltage 260 is equal to about 0.51V, the pre-load value/level may be 130. When the pre-load voltage 260 is equal to 0.51V, the activation voltage 242 is equal to 0.5078 (130 level) and the binary weight is equal to 1 (from the circuit configuration 120), the voltage at the capacitor 118 is 0.258V and the voltage at the read bit line 106 is 0.258V. This means that in this example, a charge or voltage is stored at the capacitor 118, and thus a charge/voltage is provided at the read bit line 106.

It is noted that FIGS. 8-13 are merely examples of values/levels that may be used and/or generated by various memory bitcells. FIGS. 8-13 are not meant to be all inclusive tables of all possible values. Other voltages and/or values may be possible.

Exemplary Integrated Device Comprising a Memory Bitcell

Figure 14:
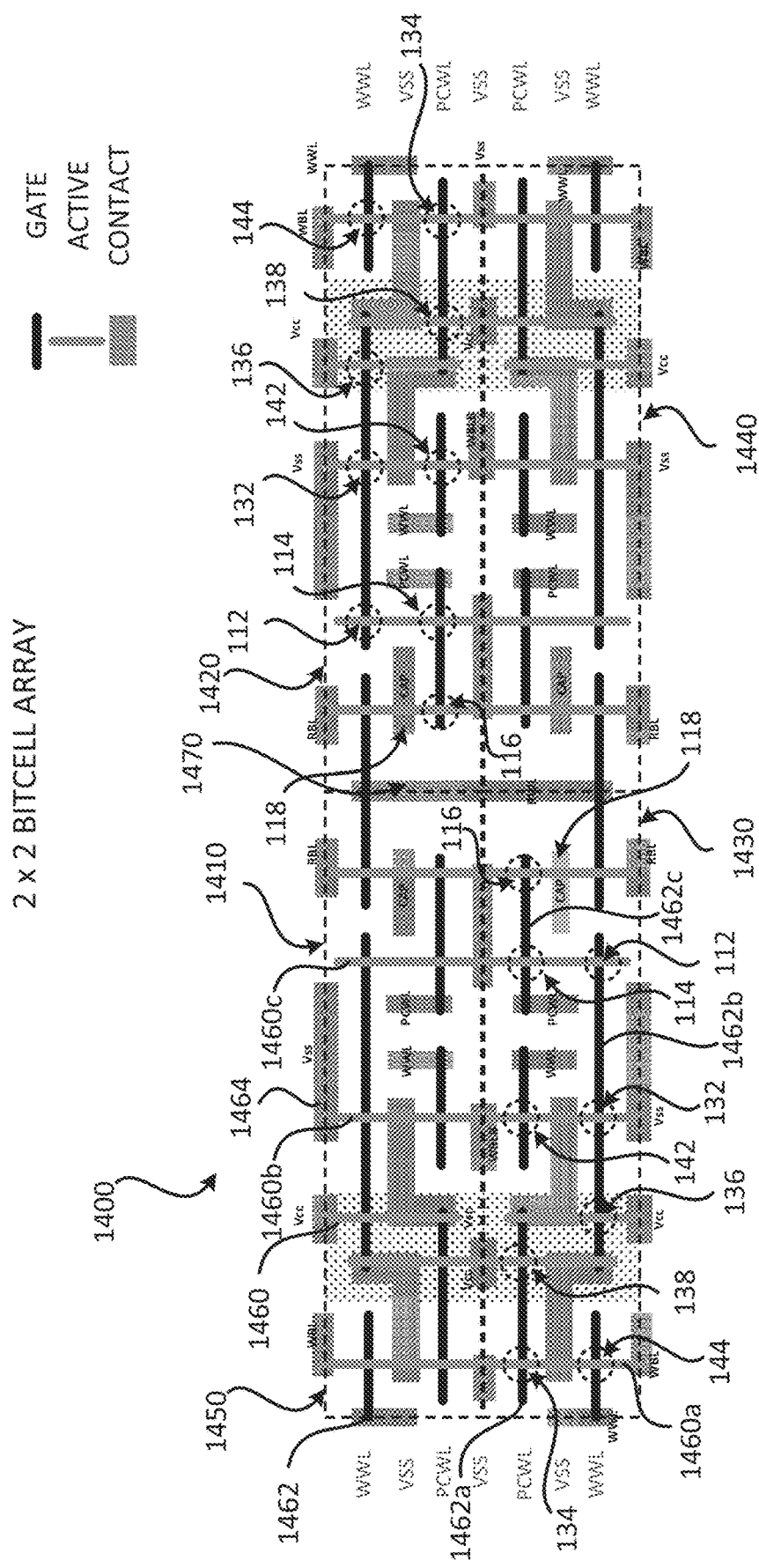
FIG. 14 illustrates a layout of an integrated device that includes a 2×2 bitcell array.

FIGS. 14-17 illustrate an exemplary plan view of a layout 1400 of an integrated device that includes one or more memory bitcells (e.g., 100, 500). FIG. 14 illustrates the layout 1400 of an integrated device that includes a first bitcell 1410, a second bitcell 1420, a third bitcell 1430 and a fourth bitcell 1440. The first bitcell 1410, the second bitcell 1420, the third bitcell 1430, and the fourth bitcell 1440 are adjacent to each other, and as further described below, at least some of the bitcells (e.g., 1410, 1420, 1430, 1440) may share one or more bit lines and/or one or more read word lines. For example, the bitcells (e.g., 1410, 1420, 1430, 1440) may share the read word line 1470 (which includes a contact). The read word line 1470 may represent the read word line 102 and/or 202. It is noted that FIGS. 14-17 is merely an example of a possible layout for a plurality of memory bitcells. Different implementations may have different layouts.

An array of bitcells 1450 may include the first bitcell 1410, the second bitcell 1420, the third bitcell 1430, and the fourth bitcell 1440. The layout 1400 may represent the components of an integrated device, formed over a substrate. The layout 1400 may include more than the four bitcells shown. In some implementations, the layout 1400 may include at least thousands and/or millions of the bitcells shown in FIG. 14. In some implementations, the layout 1400 may include at least thousands and/or millions of the array of bitcells 1450 shown in FIG. 14. The layout 1400 may illustrate a front end of line (FEOL) portion of an integrated device.

Each bitcell (e.g., 1410, 1420, 1430, 1440) may include at least one well, at least one active region 1460, a plurality of gates 1462 and a plurality of contacts 1464. The at least one well, the at least one active region 1460, the plurality of gates 1462 and/or the plurality of contacts 1464 may define one or more transistors, as described in the disclosure. FIG. 14 illustrates that the third bitcell 1430 may include the first transistor 112, the second transistor 114, the third transistor 116, the capacitor 118, the transistor 132, the transistor 134, the transistor 136, the transistor 138, the transistor 142, and the transistor 144. Each bitcell (e.g., 1410, 1420, 1430, 1440) may include its own respective first transistor 112, second transistor 114, third transistor 116, capacitor 118, transistor 132, transistor 134, transistor 136, transistor 138, transistor 142, and transistor 144. The bitcells (e.g., 1410, 1420, 1430, 1440) may correspond to the bitcells (e.g., 410, 420, 430, 440) of FIG. 4, or the bitcells (e.g., 710, 720, 730, 740) of FIG. 7. The bitcells (e.g., 1410, 1420, 1430, 1440) may be configured as NAND bitcells or NOR bitcells, as described in the disclosure. For the purpose of clarity, the transistors, gates, and active regions of the second bitcell 1420 and the third bitcell 1430 are labeled, but the transistors, gates, and active regions of the first bitcell 1410 and the fourth bitcell 1440 may not be labeled. However, the arrangement of the transistors, gates, and active regions for the first bitcell 1410 and the fourth bitcell 1440 may be arranged and/or labeled in a similar manner (e.g., accounting for possible flipped or minor configuration).

As shown in FIG. 14, some of the transistors may share the same active region and/or the same gates. For example, the transistor 134 and the transistor 138 may share a gate 1462a. The transistor 132, the transistor 136 and the transistor 112 may share a gate 1462b. The transistor 114 and the transistor 116 may share a gate 1462c. The transistor 134 and the transistor 144 may share an active region 1460a. The transistor 132 and the transistor 142 may share an active region 1460b. The transistor 112 and the transistor 114 may share an active region 1460c. Different implementations may configure the gates, active regions, contacts and/or wells differently.

The bitcells (e.g., 1410, 1420, 1430, 1440) in the array of bitcells 1450 may be configured to be symmetrically arranged. For example, the bitcell 1410 may include a first configuration, the bitcell 1420 may include a second configuration, the bitcell 1430 may include a third configuration, and the bitcell 1440 may include a fourth configuration. The second configuration of the bitcell 1420 may be a minor configuration (e.g., flipped configuration) of the first configuration of the bitcell 1410, along an Y axis. The third configuration of the bitcell 1430 may be a minor configuration (e.g., flipped configuration) of the first configuration of the bitcell 1410, along an X axis. The fourth configuration of the bitcell 1440 may be a minor configuration (e.g., flipped configuration) of the second configuration of the bitcell 1420, along an X axis. The fourth configuration of the bitcell 1440 may be a minor configuration (e.g., flipped configuration) of the third configuration of the bitcell 1430, along an Y axis. A minor configuration (e.g., flipped configuration) may be when one configuration is the same or similar to another configuration, except that the configuration has been flipped (e.g., along X-direction or Y-direction) and/or aligned in a different direction. It is noted that manufacturing processes of an integrated device may result in the configurations not being exactly the same, but generally having similar configurations (e.g., similar arrangements, locations, sizes, and/or shapes). Thus, for example, a minor configuration and/or a flipped configuration may not be exactly the same as another configuration, but includes similar configurations. As shown in FIG. 14, the various components may be configured to provide an electrical path for power (e.g., Vcc, Vdd), ground (e.g., Vss), read bit lines, read word lines, and activation lines.

Figure 15:
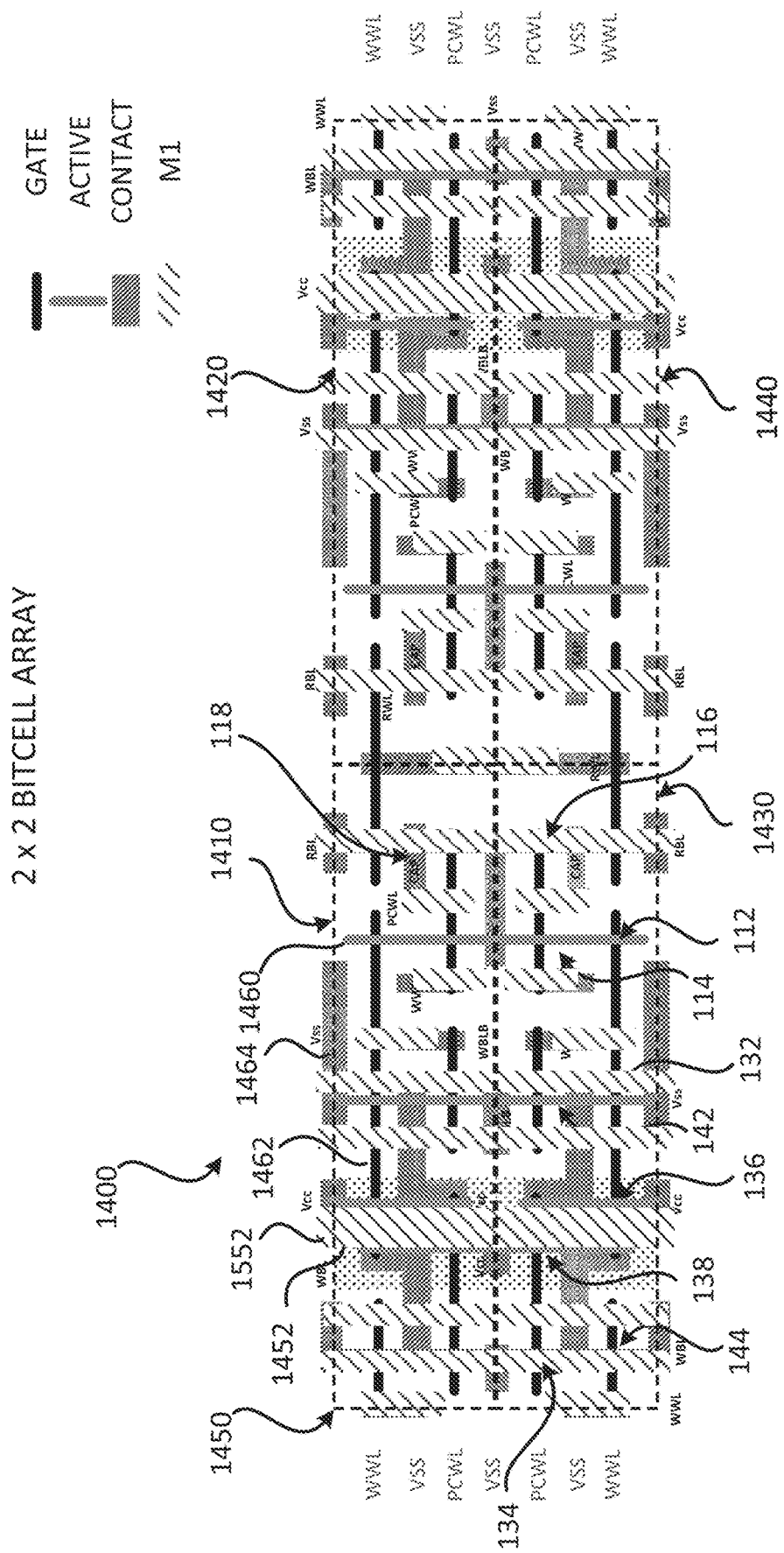
FIG. 15 illustrates a layout of an integrated device that includes a M1 layer and a 2×2 bitcell array.

FIG. 15 illustrates the layout 1400 that includes a first metal layer 1552 (M1 metal layer). The first metal layer 1552 may be coupled to the plurality of contacts 1464. The first metal layer 1552 may be formed in a back end of line (BEOL) portion of an integrated device. The first metal layer 1552 may include interconnects that travel in the Y direction and/or X-direction. The first metal layer 1552 may include interconnects that are aligned in the same direction as the at least one active region 1460. The first metal layer 1552 may be formed over the FEOL portion of the integrated device.

Figure 16:
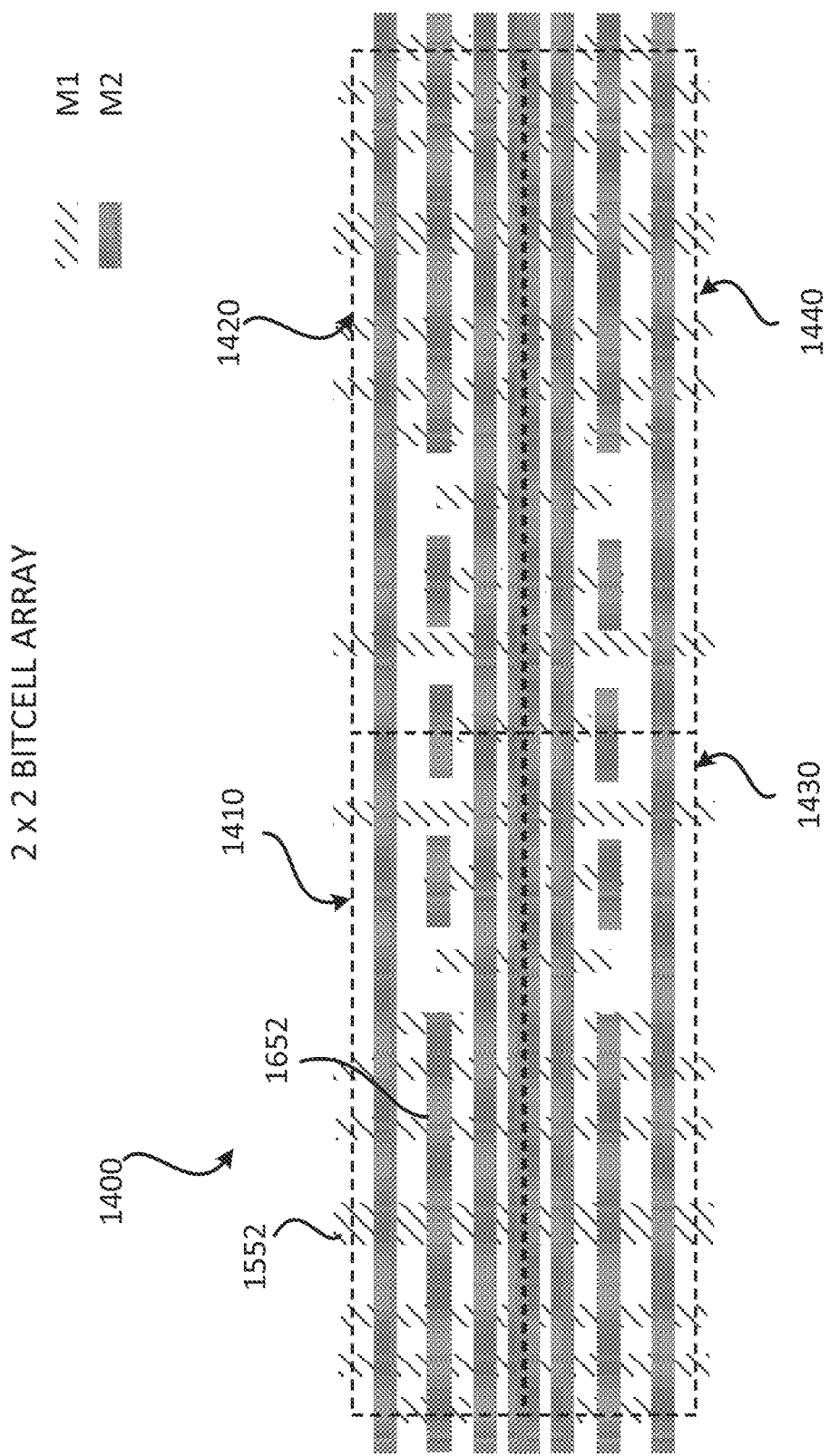
FIG. 16 illustrates a layout of an integrated device that includes a M1 layer and a M2 layer.

FIG. 16 illustrates the layout 1400 that includes a second metal layer 1652 (M2 metal layer). The second metal layer 1652 may be coupled to the first metal layer 1552 (M1 metal layer). The second metal layer 1652 may be formed in the back end of line (BEOL) portion of an integrated device. The second metal layer 1652 may include interconnects that travel in the Y direction and/or X-direction. The second metal layer 1652 may include interconnects that are aligned in the same direction as the plurality of gates 1462. The second metal layer 1652 may include interconnects that are aligned perpendicularly to interconnects of the first metal layer 1552. The interconnects from the second metal layer 1652 may be coupled to the interconnects from the first metal layer 1552 through a plurality of vias (not visible). The second metal layer 1652 may be formed over the FEOL portion of the integrated device. For the purpose of clarity, the FEOL portion (which includes the bitcells) are not shown in FIG. 16.

Figure 17:
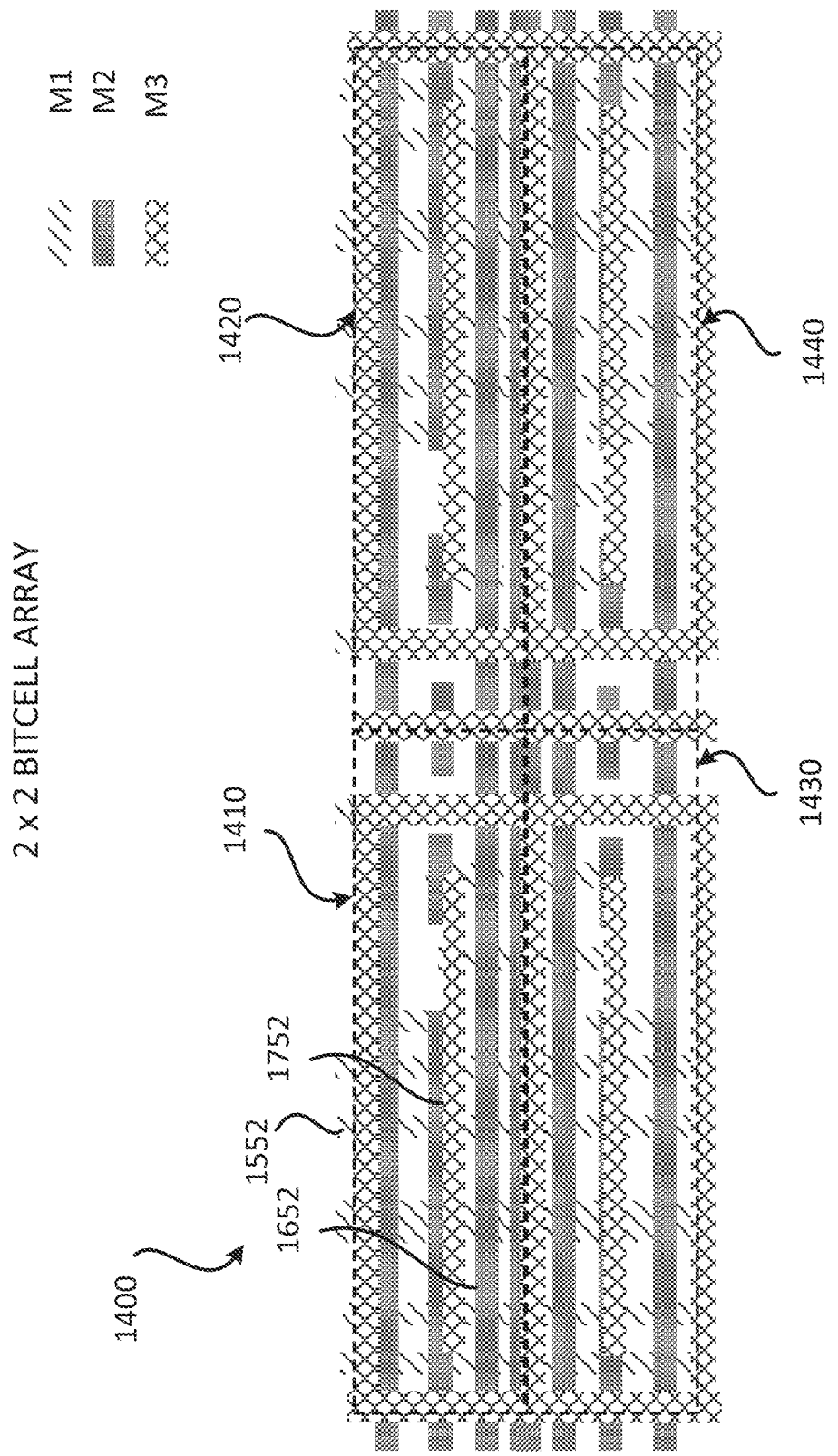
FIG. 17 illustrates a layout of an integrated device that includes a M1 layer, a M2 layer and a M3 layer.

FIG. 17 illustrates the layout 1400 that includes a third metal layer 1752 (M3 metal layer). The third metal layer 1752 may be coupled to the second metal layer 1652 (M2 metal layer). The interconnects from the third metal layer 1752 may be coupled to the interconnects from the second metal layer 1652 through a plurality of vias (not visible). The third metal layer 1752 may be formed in the back end of line (BEOL) portion of an integrated device. The third metal layer 1752 may include interconnects that travel in the Y direction and/or X-direction. For the purpose of clarity, the FEOL portion (which includes the bitcells) are not shown in FIG. 17.

Exemplary Integrated Device Comprising a Memory Bitcell

Figure 18:
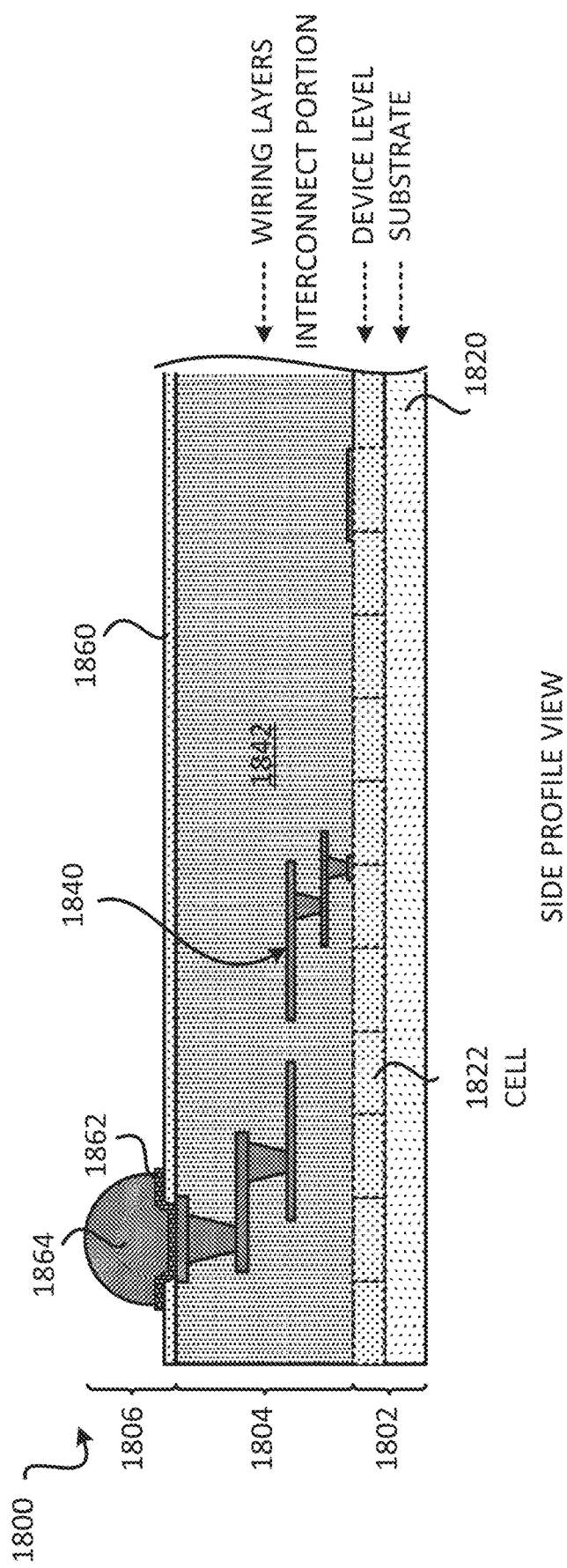
FIG. 18 illustrates a profile view of an integrated device that includes memory bitcells.

FIG. 18 illustrates a profile view of an integrated device 1800 that includes one or more memory bitcells (e.g., 100, 500). The integrated device 1800 includes a substrate 1820, a plurality of device level cells 1822 (e.g., logic cells), interconnect portion 1804, and a packaging portion 1806. The plurality of device level cells 1822 is formed over the substrate 1820. The plurality of device level cells 1822 may form the device level layer of the integrated device 1800. In some implementations, the plurality of device level cells 1822 may include portions of the substrate 1820. In some implementations, the substrate 1820 and the plurality of device level cells 1822 may be referred as the substrate portion 1802 of the integrated device 1800.

The plurality of device level cells 1822 may include the memory bitcells (e.g., 100, 500) and/or the array (e.g., 400, 700) that includes a plurality of memory bitcells. Different implementations may have different numbers and/or arrangements of memory cells. A memory bitcell may include transistors (e.g., semiconductor transistor). Different implementations may use different types of transistors, such as a field effect transistor (FET), planar FET, finFET, and a gate all around FET.

The interconnect portion 1804 is formed over the substrate portion 1802. In particular, the interconnect portion 1804 is formed over the plurality of device level cells 1822. The interconnect portion 1804 includes wiring layers. The interconnect portion 1804 includes a plurality of interconnects 1840 (e.g., trace, pad, vias) and at least one dielectric layer 1842. The interconnect portion 1804 may provide interconnect between the plurality of memory bitcells.

A packaging portion 1806 is formed over the interconnect portion 1804. The packaging portion 1806 includes a passivation layer 1860, an under bump metallization (UBM) layer 1862 and a solder interconnect 1864. It is noted that the size and shape of the integrated device 1800 is exemplary. Moreover, the components of the integrated device 1800 shown may not be to scale.

Figure 19A:
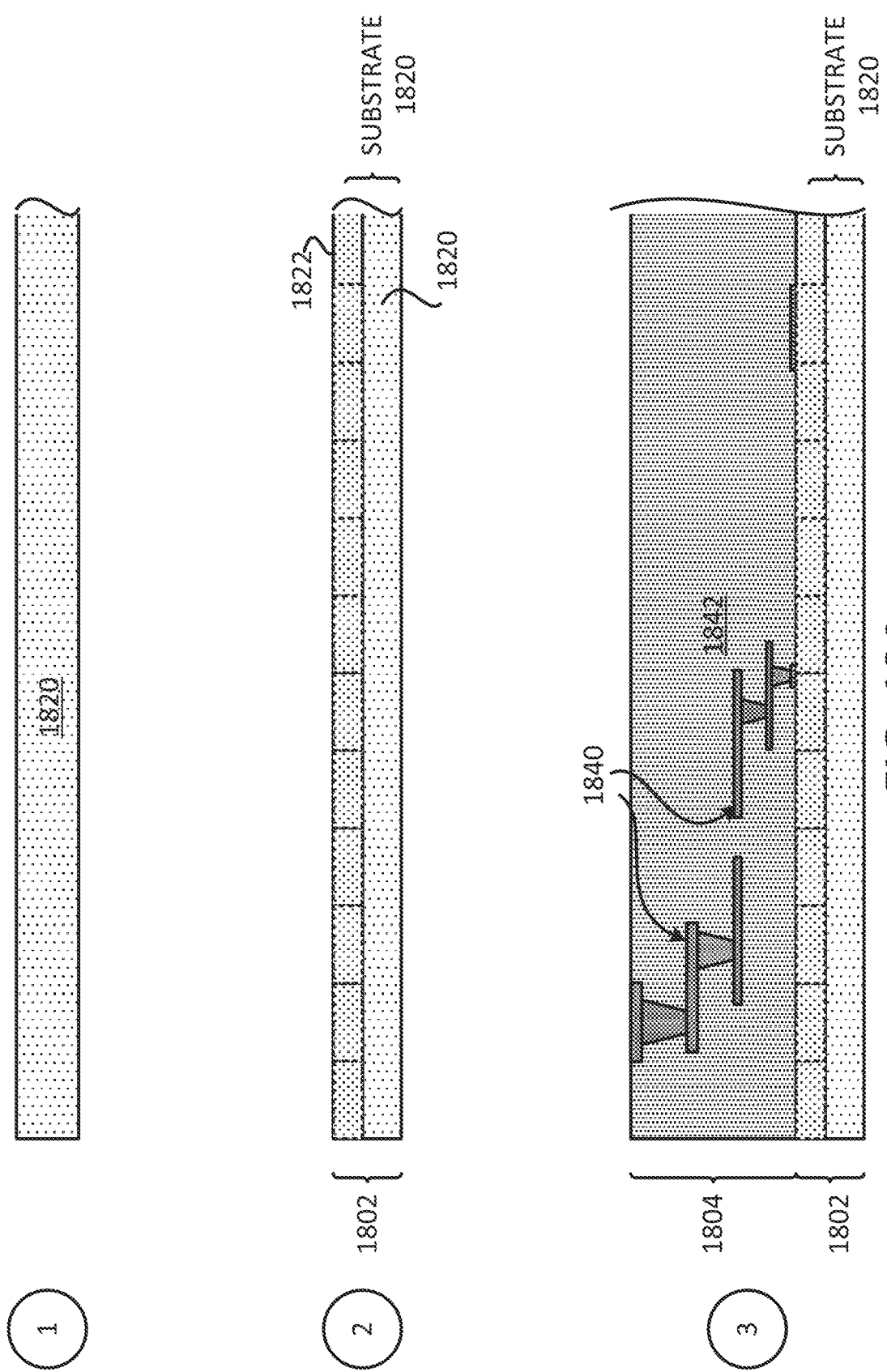
FIG. 19 (comprising FIGS. 19A-19B) illustrates an exemplary sequence for fabricating an integrated device that includes transistors for bitcells.
Figure 19B:
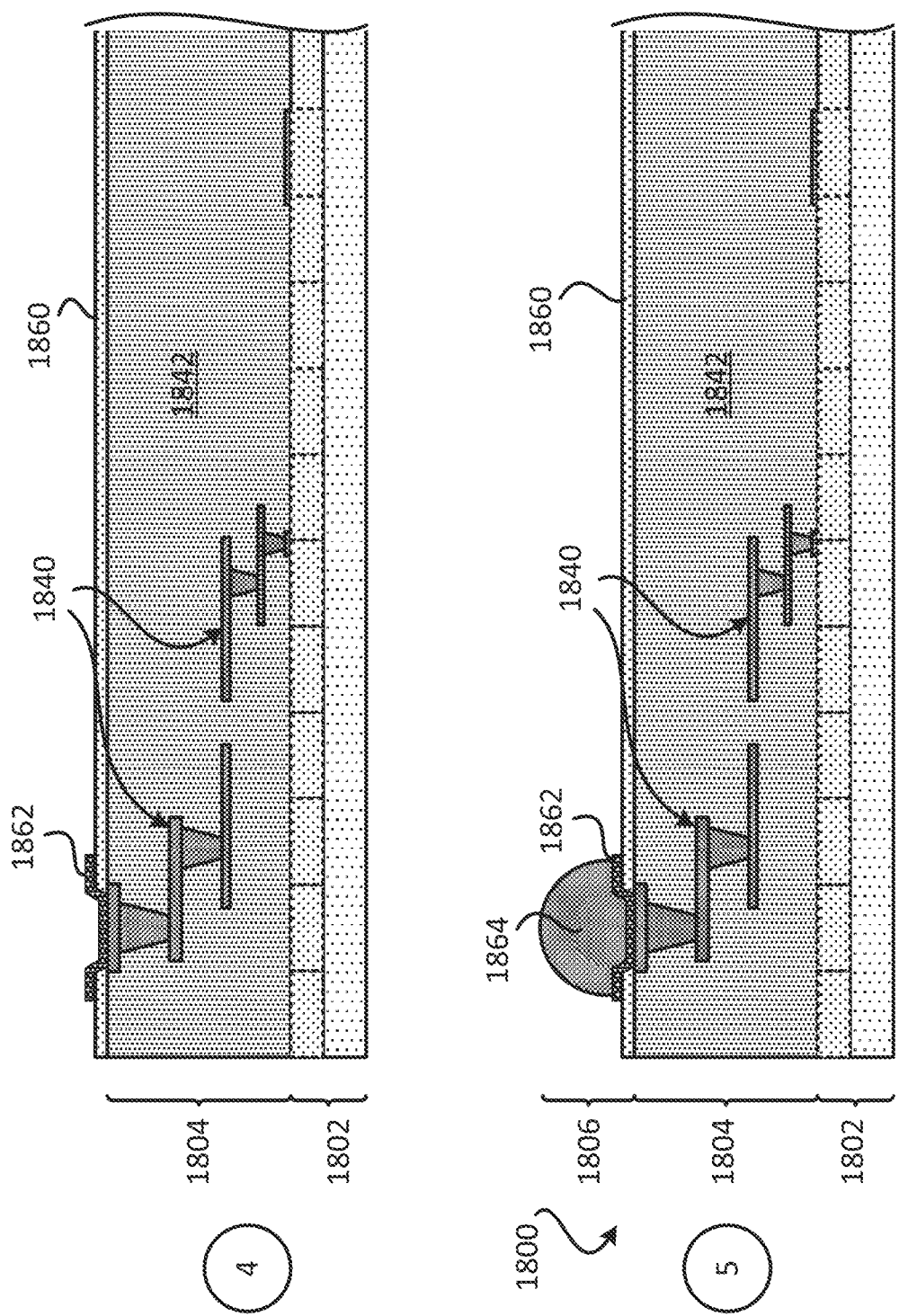

Exemplary Sequence for Fabricating an Integrated Device Comprising a Memory Bitcell In some implementations, fabricating an integrated device that includes a memory bitcell includes several processes. FIG. 19 (which includes FIGS. 19A-19B) illustrates an exemplary sequence for providing or fabricating an integrated device that includes memory bitcells. In some implementations, the sequence of FIGS. 19A-19B may be used to provide or fabricate the integrated device of FIG. 18 and/or other integrated devices described in the present disclosure.

It should be noted that the sequence of FIGS. 19A-19B may combine one or more stages in order to simplify and/or clarify the sequence for providing or fabricating an integrated device that includes memory bitcells. In some implementations, the order of the processes may be changed or modified. In some implementations, one or more of processes may be replaced or substituted without departing from the spirit of the disclosure.

Stage 1, as shown in FIG. 19A, illustrates a state after a substrate 1820 is provided. Different implementations may provide different materials for the substrate 1820. In some implementations, the substrate 1820 may include silicon (Si). The substrate may include wells (e.g., N well, P well).

Stage 2 illustrates a state after the device level layer is formed over the substrate 1820. The device level layer includes the plurality of device level cells 1822. Thus, Stage 2 illustrates a state after the plurality of device level cells 1822 is formed over the substrate 1820. In some implementations, a front end of line (FEOL) process may be used to fabricate the device level layer (e.g., plurality of device level cells 1822). One or more of cells from the plurality of device level cells may include memory bitcells (e.g., 100, 500).

Stage 3 illustrates a state after the interconnect portion 1804 is formed. The interconnect portion 1804 may include plurality of interconnects 1840 and at least one dielectric layer 1842. In some implementations, a back end of line (BEOL) process may be used to fabricate interconnect portion 1804. The interconnect portion 1804 may be configured to electrically couple memory bitcells.

Stage 4, as shown in FIG. 19B, illustrates a state after a passivation layer 1860 and the under bump metallization (UBM) layer 1862 are formed over the interconnect portion 1804.

Stage 5 illustrates a state after a solder interconnect is coupled to the under bump metallization (UBM) layer 1862. Stage 18 may illustrate the integrated device 1800 of FIG. 18.

Figure 20:
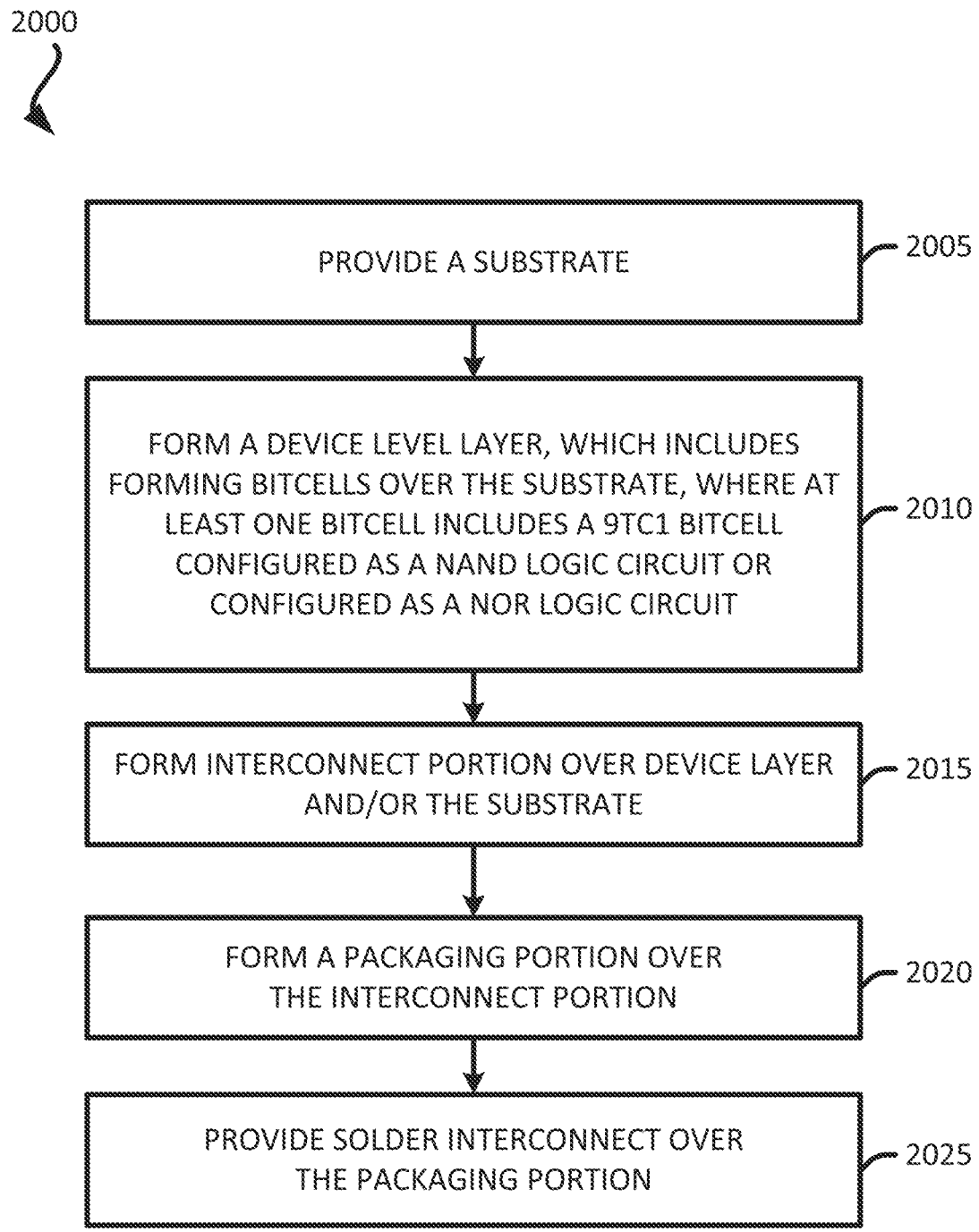
FIG. 20 illustrates an exemplary flow diagram of a method for fabricating an integrated device that includes transistors for bitcells.

Exemplary Flow Diagram of a Method for Fabricating an Integrated Device Comprising a Memory Bitcell In some implementations, providing an integrated device that includes a memory bitcell includes several processes. FIG. 20 illustrates an exemplary flow diagram of a method 2000 for providing or fabricating an integrated device that includes a memory bitcell. In some implementations, the method 2000 of FIG. 20 may be used to provide or fabricate the integrated device of FIG. 18 and/or other integrated devices described in the present disclosure.

It should be noted that the sequence of FIG. 20 may combine one or more processes in order to simplify and/or clarify the method for providing or fabricating an integrated device that includes a memory bitcell. In some implementations, the order of the processes may be changed or modified.

The method provides (at 2005) a substrate (e.g., 1520). Different implementations may provide different materials for the substrate. In some implementations, the substrate may include silicon (Si). The substrate may be doped with an N type dopant or a P type dopant. Providing the substrate may include forming wells (e.g., N well, P well) in the substrate.

The method forms (at 2010) a device level layer (e.g., the plurality of device level cells 1822) over the substrate. In some implementations, a front end of line (FEOL) process may be used to fabricate the device level layer (e.g., plurality of device level cells 1822). The device level layer may include a plurality of memory bit cells (e.g., 100, 500). The device level cells may include one or more active devices (e.g., transistor). One or more device level cells may include a structure having a NMOS transistor and/or a PMOS transistor, as described in the disclosure. Forming the device level layer may include forming one or more NMOS transistors and/or one or more PMOS transistors. In some implementations, forming a device level layer includes forming a first transistor over the substrate. Forming the first transistor may include forming a first source over the substrate, forming a first drain over the substrate, forming a first plurality of channels between the first source and the first drain. Forming a first transistor may also include forming a first gate that surrounds the channels.

The method forms (at 2015) an interconnect portion 1804 over the device level layer (e.g., plurality of device level cells 1822) and/or the substrate 1820. The interconnect portion 1804 may include a plurality of interconnect 1840 and at least one dielectric layer 1842. In some implementations, a back end of line (BEOL) process may be used to form the interconnect portion 1904. The interconnect portion 1804 may be configured to electrically couple one or more transistors, and/or one or more CMOS structures having a NMOS transistor and a PMOS transistor.

The method forms (at 2020) a packaging portion 1806 over the interconnect portion 1904. The packaging portion 1506 may include the passivation layer 1860 and the under bump metallization (UBM) layer 1862. The passivation layer 1860 and the under bump metallization (UBM) layer 1862 are formed over the interconnect portion 1804.

The method provides (at 2025) a solder interconnect 1864. In some implementations, the solder interconnect 1864 is coupled to the under bump metallization (UBM) layer 1862

It is also noted that the method 2000 of FIG. 20 may be used to fabricate (e.g., concurrently fabricate) several integrated devices on a wafer. The wafer is then singulated (e.g., cut) into individual integrated devices. These singulated integrated devices may then be coupled to other integrated devices and/or printed circuit boards (PCBs).

Exemplary Electronic Devices

Figure 21:
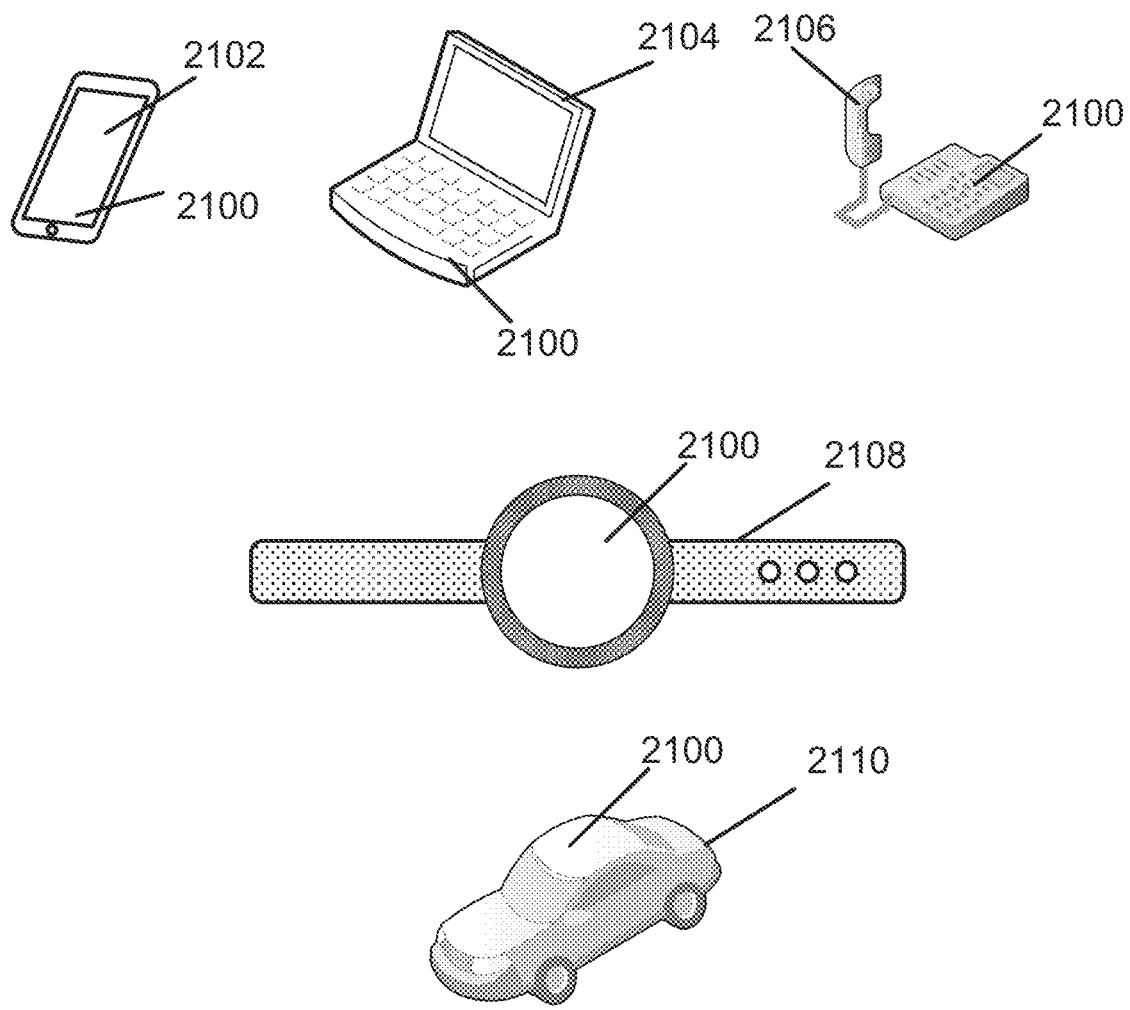
FIG. 21 illustrates various electronic devices that may integrate a memory circuit, a die, an integrated device, an integrated passive device (IPD), a device package, a package, an integrated circuit and/or PCB described herein.

FIG. 21 illustrates various electronic devices that may be integrated with any of the aforementioned transistor, CMOS, NMOS transistor, PMOS transistor, device, bitcell, memory bitcell, memory circuit, integrated device, integrated circuit (IC) package, integrated circuit (IC) device, semiconductor device, integrated circuit, die, interposer, package or package-on-package (PoP). For example, a mobile phone device 2102, a laptop computer device 2104, a fixed location terminal device 2106, or a wearable device 2108 may include a device 2100 as described herein. The device 2100 may be, for example, any of the devices and/or integrated circuit (IC) packages described herein. The devices 2102, 2104, 2106 and 2108 illustrated in FIG. 21 are merely exemplary. Other electronic devices may also feature the device 2100 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-2, 3A-3C, 4, 5, 6A-6C, 7-18, 19A-19B and/or 20-21 may be rearranged and/or combined into a single component, process, feature or function or embodied in several components, processes, or functions. Additional elements, components, processes, and/or functions may also be added without departing from the disclosure. It should also be noted FIGS. 1-2, 3A-3C, 4, 5, 6A-6C, 7-18, 19A-19B and/or 20-21 and its corresponding description in the present disclosure is not limited to dies and/or ICs. In some implementations, FIGS. 1-2, 3A-3C, 4, 5, 6A-6C, 7-18, 19A-19B and/or 20-21 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional. The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The use of the terms "first", "second", "third" and "fourth" (and anything above fourth) is arbitrary. Any of the components described may be the first, second, third or fourth. For example, a component that is referred to a second component, may be the first component, the second component, the third component or the fourth component. The direction specified in the disclosure is arbitrary. For example, the use of X-axis, Y-axis, Z-axis, Y direction, X direction, Z direction, vertical direction, horizontal direction is arbitrary. Different implementations may specify directions differently for different implementations. The term etching may include dry etching or wet etching, and may involve the use of a mask. Forming or disposing a metal may include a plating process, a chemical vapor deposition (CVP) process, and/or an atomic layer deposition (ALD) process. In some implementations, forming one or more dielectric layers, and/or Si may include one or more deposition processes.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A memory circuit comprising:
a memory bitcell comprising:
  a six-transistor circuit configuration;
  a first transistor coupled to the six-transistor circuit configuration;
  a second transistor coupled to the first transistor;
  a third transistor coupled to the second transistor; and
  a capacitor coupled to the second transistor and the third transistor;
a read word line coupled to the third transistor;
a read bit line coupled to the third transistor; and
an activation line coupled to the second transistor.

2. The memory circuit of claim 1,
wherein the first transistor is coupled to the second transistor in series, and
wherein the memory bitcell is configured to operate as a NAND memory bitcell.

3. The memory circuit of claim 1,
wherein the first transistor is coupled to the second transistor in parallel, and
wherein the memory bitcell is configured to operate as a NOR memory bitcell.

4. The memory circuit of claim 1,
wherein the read word line is configured to provide a binary pre-load value to the memory bitcell, and
wherein the activation line is configured to provide a binary activation value to the memory bitcell.

5. The memory circuit of claim 1,
wherein the read word line is configured to provide a multi-bit pre-load value to the memory bitcell, and
wherein the activation line is configured to provide a binary activation value to the memory bitcell.

6. The memory circuit of claim 1,
wherein the read word line is configured to provide a multi-bit pre-load value to the memory bitcell, and
wherein the activation line is configured to provide a multi-bit activation value to the memory bitcell.

7. The memory circuit of claim 1, wherein the memory circuit is implemented in an integrated device.

8. A memory circuit comprising:
a first memory bitcell;
a second memory bitcell;
a third memory bitcell;
a fourth memory bitcell;
wherein the first memory bitcell, the second memory bitcell, the third memory bitcell, and the fourth memory bitcell, each comprises:
  a six-transistor circuit configuration;
  a first transistor coupled to the six-transistor circuit configuration;
  a second transistor coupled to the first transistor;
  a third transistor coupled to the second transistor; and
  a capacitor coupled to the second transistor and the third transistor;
a first read word line coupled to the third transistor of the first memory bitcell and the third transistor of the third memory bitcell;
a first read bit line coupled to the third transistor of the first memory bitcell and the third transistor of the third memory bitcell;
a first activation line coupled to the second transistor of the first memory bitcell and the second transistor of the second memory bitcell;
a second read word line coupled to the third transistor of the second memory bitcell and the third transistor of the fourth memory bitcell;
a second read bit line coupled to the third transistor of the second memory bitcell and the third transistor of the fourth memory bitcell; and
a second activation line coupled to the second transistor of the third memory bitcell and the second transistor of the fourth memory bitcell.

9. The memory circuit of claim 8,
wherein the first transistor is coupled to the second transistor in series, and
wherein the first memory bitcell, the second memory bitcell, the third memory bitcell, and the fourth memory bitcell, are each configured to operate as a NAND memory bitcell.

10. The memory circuit of claim 8,
wherein the first transistor is coupled to the second transistor in parallel, and
wherein the first memory bitcell, the second memory bitcell, the third memory bitcell, and the fourth memory bitcell, are each configured to operate as a NOR memory bitcell.

11. The memory circuit of claim 8,
wherein the first memory bitcell comprises a first configuration,
wherein the second memory bitcell comprises a second configuration, and
wherein the second configuration is a flipped configuration of the first configuration along an Y axis.

12. The memory circuit of claim 11,
wherein the third memory bitcell comprises a third configuration,
wherein the fourth memory bitcell comprises a fourth configuration,
wherein the third configuration is a flipped configuration of the first configuration along an X axis, and
wherein the fourth configuration is a flipped configuration of the second configuration along an X axis.

13. The memory circuit of claim 8, wherein the first read word line is coupled to the second read word line.

14. The memory circuit of claim 8, wherein the memory circuit is implemented in an integrated device.

15. An integrated device comprising:
a substrate;
a memory bitcell located over the substrate, the memory bitcell comprising:
  a six-transistor circuit configuration;
  a first transistor coupled to the six-transistor circuit configuration;
  a second transistor coupled to the first transistor;
  a third transistor coupled to the second transistor; and
  a capacitor coupled to the second transistor and the third transistor;
a read word line located over the substrate, wherein the read word line is coupled to the third transistor;
a read bit line located over the substrate, wherein the read bit line is coupled to the third transistor; and
an activation line located over the substrate, wherein the activation line is coupled to the second transistor.

16. The integrated device of claim 15,
wherein the first transistor is coupled to the second transistor in series, and
wherein the memory bitcell is configured to operate as a NAND memory bitcell.

17. The integrated device of claim 15,
wherein the first transistor is coupled to the second transistor in parallel, and
wherein the memory bitcell is configured to operate as a NOR memory bitcell.

18. The integrated device of claim 15,
wherein the first transistor and the second transistor share a same active region, and
wherein the second transistor and the third transistor share a same gate.

19. The integrated device of claim 15, wherein the first transistor and at least one transistor from the six-transistor circuit configuration share a same gate.

20. The integrated device of claim 15, further comprising a plurality of memory bitcells, wherein each respective memory bitcell comprises:
a respective six-transistor circuit configuration;
a respective first transistor coupled to the respective six-transistor circuit configuration;
a respective second transistor coupled to the respective first transistor;
a respective third transistor coupled to the respective second transistor; and
a respective capacitor coupled to the respective second transistor and the respective third transistor.

21. An integrated device comprising:
a substrate;
a memory bitcell located over the substrate, the memory bitcell comprising:
means for transistor circuit operation;
first means for transistor operation coupled to the means for transistor circuit operation;
second means for transistor operation coupled to the first means for transistor operation;
third means for transistor operation coupled to the second means for transistor operation; and
means for capacitance coupled to the second means for transistor operation and the third means for transistor operation;
a read word line located over the substrate, wherein the read word line is coupled to the third means for transistor operation;
a read bit line located over the substrate, wherein the read bit line is coupled to the third means for transistor operation; and
an activation line located over the substrate, wherein the activation line is coupled to the second means for transistor operation.

22. The integrated device of claim 21,
wherein the first means for transistor operation is coupled to the second means for transistor operation in series, and
wherein the memory bitcell is configured to operate as a NAND memory bitcell.

23. The integrated device of claim 21,
wherein the first means for transistor operation is coupled to the second means for transistor operation in parallel, and
wherein the memory bitcell is configured to operate as a NOR memory bitcell.

24. The integrated device of claim 21,
wherein the first means for transistor operation and the second means for transistor operation share a same active region, and
wherein the second means for transistor operation and the third means for transistor operation share a same gate.

25. The integrated device of claim 21, wherein the first means for transistor operation and at least one transistor from the means for transistor circuit operation share a same gate.

26. The integrated device of claim 21, wherein the integrated device is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

* * * * *